(12) United States Patent
Yang

(10) Patent No.: US 11,502,085 B2
(45) Date of Patent: Nov. 15, 2022

(54) INTEGRATED MEMORY WITH REDISTRIBUTION OF CAPACITOR CONNECTIONS, AND METHODS OF FORMING INTEGRATED MEMORY

(71) Applicant: Micron Technology, Inc., Boise, ID (US)

(72) Inventor: Guangjun Yang, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 302 days.

(21) Appl. No.: 16/830,662

(22) Filed: Mar. 26, 2020

(65) Prior Publication Data
US 2021/0305254 A1 Sep. 30, 2021

(51) Int. Cl.
 H01L 27/108 (2006.01)
 H01L 49/02 (2006.01)
 G11C 5/02 (2006.01)
 G11C 5/10 (2006.01)
 G11C 11/402 (2006.01)

(52) U.S. Cl.
 CPC ........ H01L 27/10805 (2013.01); G11C 5/025 (2013.01); G11C 5/10 (2013.01); G11C 11/4023 (2013.01); H01L 28/40 (2013.01)

(58) Field of Classification Search
 CPC ......... H01L 27/10805; H01L 27/10855; H01L 28/40; H01L 27/10814; G11C 5/10; G11C 5/025; G11C 11/4023; G11C 11/402
 USPC ................................................ 257/296, 438
 See application file for complete search history.

(56) References Cited

U.S. PATENT DOCUMENTS 10,461,149 B1 * 10/2019 Tang ................. H01L 27/10855

* cited by examiner

*Primary Examiner* — Hrayr A Sayadian
(74) *Attorney, Agent, or Firm* — Wells St. John P.S.

(57) ABSTRACT

Some embodiments include an integrated assembly. The integrated assembly includes active regions which each have a digit-line-contact-region between a pair of capacitor-contact-regions. The capacitor-contact-regions are arranged in a pattern such that six adjacent capacitor-contact-regions form a substantially rectangular configuration. Conductive redistribution material is coupled with the capacitor-contact-regions and extends upwardly and laterally outwardly from the capacitor-contact-regions. Upper surfaces of the conductive redistribution material are arranged in a pattern such that seven adjacent of the upper surfaces form a unit of a substantially hexagonal-close-packed configuration. Capacitors are coupled with the upper surfaces of the conductive redistribution material.

20 Claims, 15 Drawing Sheets

US 11,502,085 B2

INTEGRATED MEMORY WITH REDISTRIBUTION OF CAPACITOR CONNECTIONS, AND METHODS OF FORMING INTEGRATED MEMORY

TECHNICAL FIELD

Integrated assemblies. Integrated memory (e.g., DRAM). Integrated memory with redistribution of capacitor connections. Methods of forming integrated memory.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and digit lines extending along columns of the array. The wordlines may be coupled with the transistors of the memory cells. Each memory cell may be uniquely addressed through a combination of one of the wordlines with one of the digit lines.

Tight packing of capacitors becomes increasingly important with increasing levels of integration. It is desired to develop architectures which enable tight packing of the capacitors of a DRAM array, and to develop methods for fabricating such architectures.

DETAILED DESCRIPTION OF THE ILLUSTRATED EMBODIMENTS

Some embodiments include methods of forming conductive redistribution structures which convert a rectangular pattern of interconnection regions (e.g., container-contact-regions of a DRAM array) to a hexagonal pattern (e.g., a pattern which is substantially hexagonal-close-packed). Some embodiments include integrated assemblies (e.g., DRAM assemblies) having patterns of interconnection regions which are substantially hexagonal-close-packed. Example embodiments are described with reference to the figures provided herewith.

Figure 1:
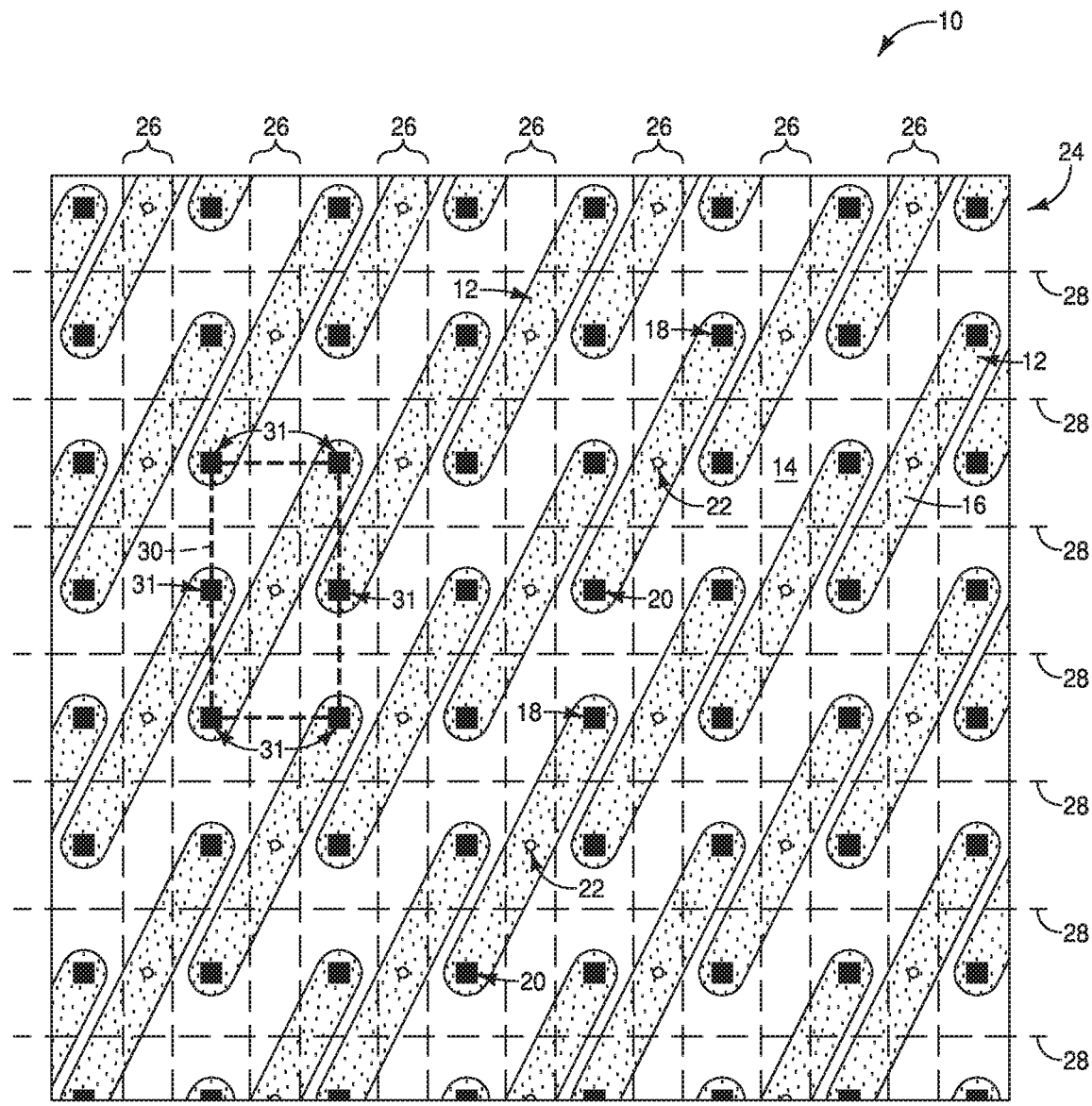
FIG. 1 is a diagrammatic top-down view of a region of an example memory array.

Referring to FIG. 1, a region of an integrated assembly 10 is shown in a diagrammatic top-down view. The assembly comprises a plurality of active regions 12 (only some of which are labeled), which are spaced from one another by insulative material 14. The active regions 12 are stippled to assist the reader in distinguishing them from the intervening insulative material 14.

The active regions 12 comprise semiconductor material 16. The semiconductor material 16 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material may comprise silicon. Such silicon may be in any suitable crystalline form (e.g., monocrystalline, polycrystalline, amorphous, etc.), and in some embodiments may comprise, consist essentially of, or consist of monocrystalline silicon with one or more suitable dopants provided therein.

Each of the active regions 12 is shown to include a pair of capacitor-contact-regions 18 and 20 (represented with square-shaped structures), and to comprise a digit-line-contact-region 22 between the capacitor-contact-regions. The digit-line-contact-regions 22 are represented by circle-shaped structures.

The capacitor-contact-regions 18 and 20 may be referred to as a first and second capacitor-contact-regions, respectively.

The capacitor-contact-regions 18, 20 may be considered to be distributed in an array 24. Digit lines 26 extend along columns of the array, and wordlines 28 extend along rows of the array.

The capacitor-contact-regions 18, 20 are arranged in a pattern such that six adjacent capacitor-contact-regions form a substantially rectangular configuration 30, with one of such rectangular configurations 30 being labeled and identified in FIG. 1. The term "substantially rectangular" means rectangular to within reasonable tolerances of fabrication and measurement. The six capacitor-contact-regions utilized in the rectangular configuration 30 of FIG. 1 are labeled as regions 31.

A difficulty encountered during fabrication of integrated memory is that it is desired to form storage elements (e.g., capacitors) which are electrically coupled with each of the capacitor-contact-regions 18, 20. The rectangular pattern 30 may limit the packing density of the storage elements. Accordingly, it may be desired to provide redistribution material over the capacitor-contact-regions 18, 20 to alter the pattern available for contact with storage elements.

The term "storage element" refers to any suitable device having at least two detectable states; and in some embodiments may be, for example, a capacitor, a resistive-memory device, a conductive-bridging device, a phase-change-memory (PCM) device, a programmable metallization cell (PMC), etc. For purposes of explaining example embodiments, the "storage elements" may be referred to as capacitors, and may be represented as capacitors. However, it is to be understood that in other embodiments such capacitors may be replaced with any suitable storage elements.

Figure 2:
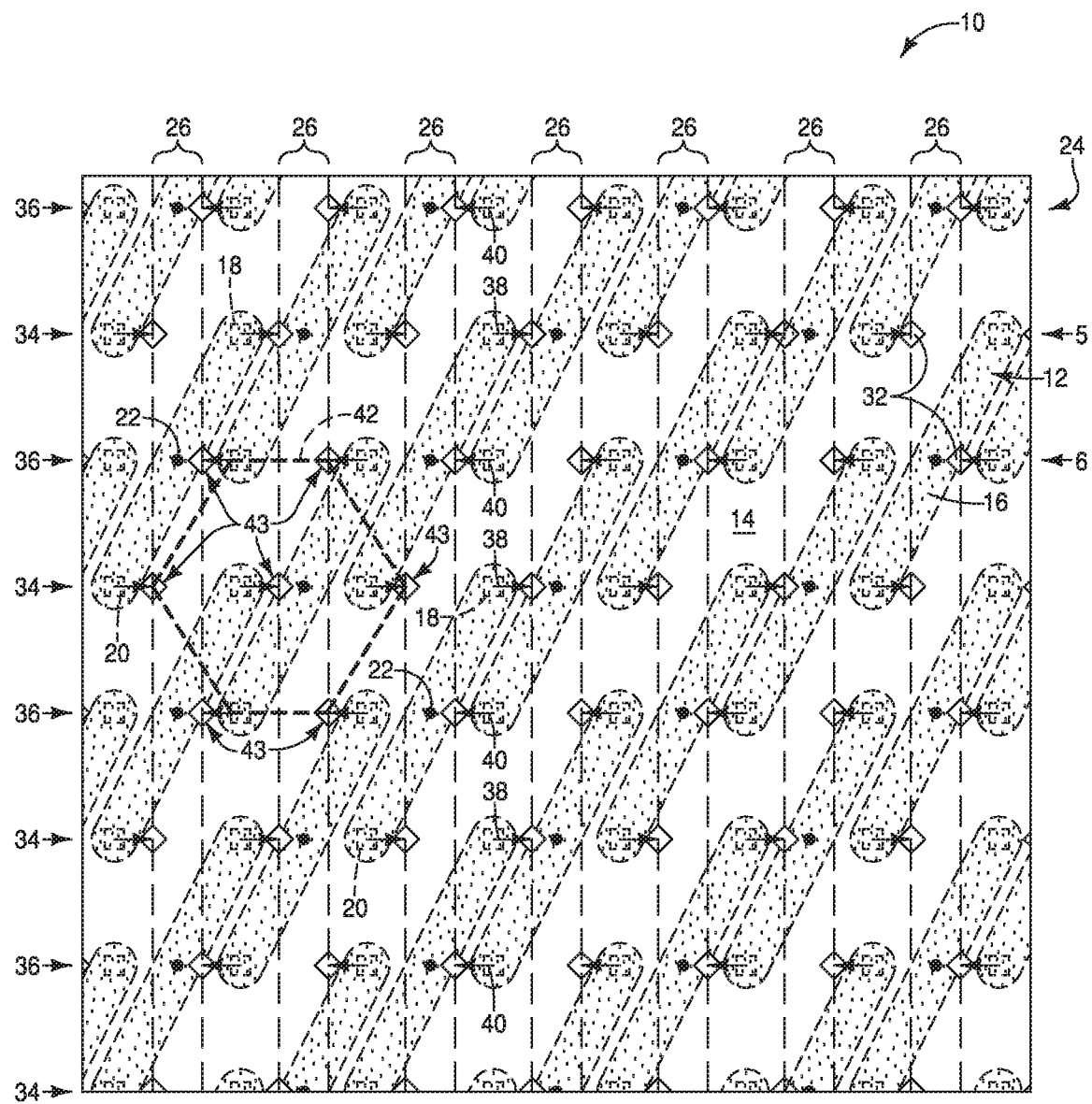
FIG. 2 is a diagrammatic top-down view of an example memory array modified relative to the memory array of FIG. 1.

FIG. 2 shows the assembly 10 after redistribution material 32 is utilized to shift locations for the contacts to the capacitors (storage elements). Upper surfaces of the redistribution material 32 are indicated with diamond-shaped structures.

The wordlines 28 are not shown in FIG. 2 to simplify the drawing.

The capacitor-contact-regions 18, 20 are shown in dashed-line (phantom) view in FIG. 2 to indicate that other materials (e.g., redistribution materials) have been formed over the capacitor-contact-regions. The redistribution material 32 is coupled with the capacitor-contact-regions 18, 20, and extends upwardly and laterally outwardly from such capacitor-contact-regions. The array 24 of the capacitor-contact regions 18, 22 may be considered to comprise alternating first and second rows 34 and 36. The redistribution material 32 along the first rows 34 has a first configuration such that the upper surfaces of the redistribution material 32 are shifted in a first direction 38 relative to the capacitor-contact-regions 18, 20; and the redistribution material 32 along the second rows 34 has a second configuration such that the upper surfaces of the redistribution material 32 are shifted in a second direction 40 relative to the capacitor-contact regions 18, 20. In the illustrated embodiment the first direction 38 is a rightward direction and the second direction 40 is a leftward direction. The second direction 40 may be considered to be substantially opposite to the first direction 38, with the term "substantially opposite" meaning opposite to within reasonable tolerances of fabrication and measurement.

The upper surfaces of the redistribution material 32 are arranged in a pattern such that seven adjacent upper surfaces of the conductive redistribution material 32 form a unit of a substantially hexagonal-close-packed configuration 42, with one of such units being labeled and identified in FIG. 2. The term "substantially hexagonal-close-packed" means hexagonal-close-packed to within reasonable tolerances of fabrication and measurement. The seven adjacent upper surfaces of the conductive redistribution material utilized in the configuration 42 are labeled as surfaces 43. The hexagonal-close-packing may enable capacitors to be tightly arranged across the underlying active regions 12. In some embodiments, the hexagonal-close-packing may maximize the packing density that may be achieved with some capacitor configurations (e.g., cylindrical configurations).

Figure 3:
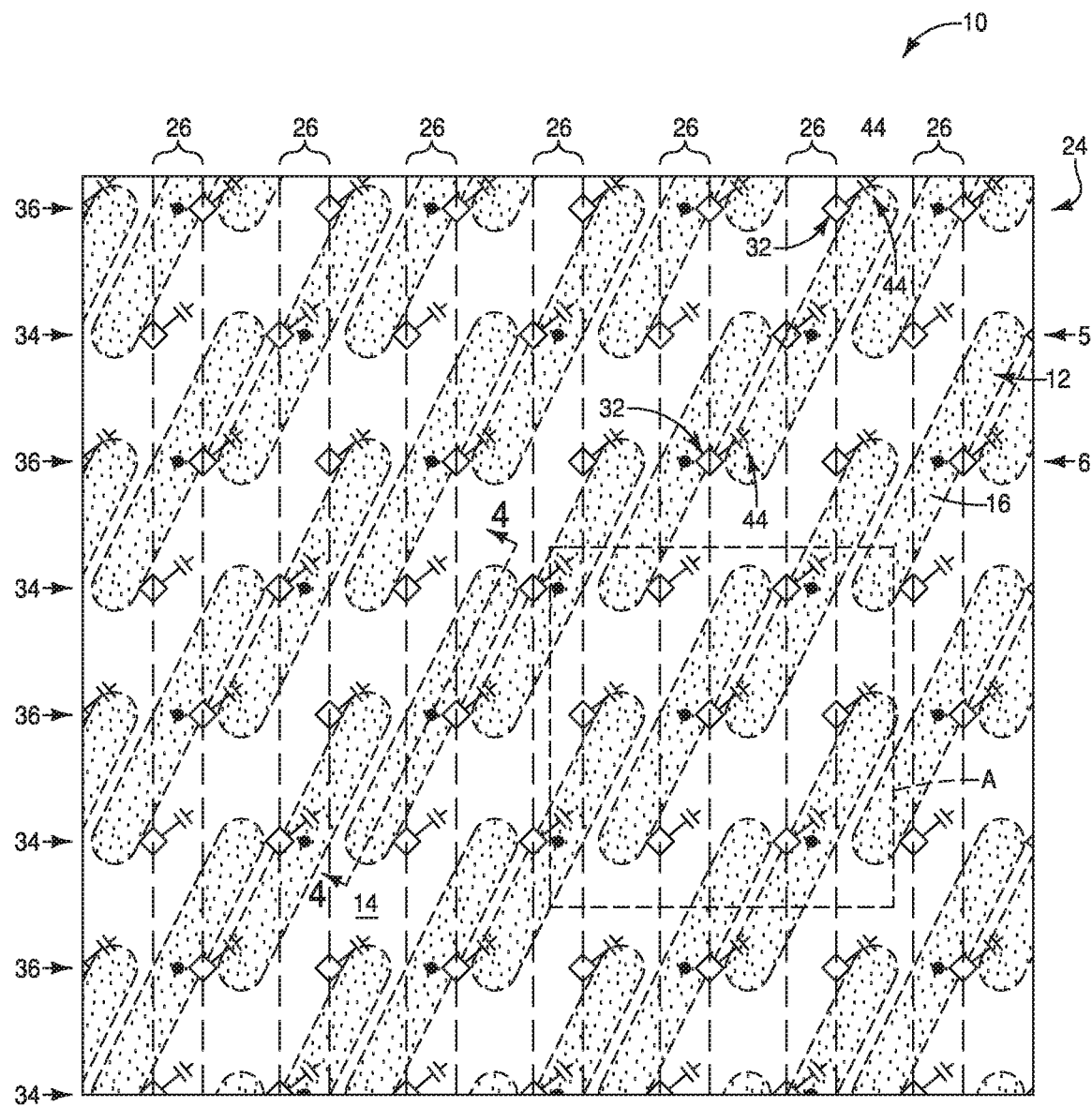
FIG. 3 is another diagrammatic top-down view of the modified memory array of FIG. 2.

FIG. 3 shows the assembly 10 of FIG. 2 without the capacitor-contact-regions (18, 20) and without the shifted directions (38, 40), to simplify the drawing. Capacitors 44 are shown to be electrically coupled with the upper surfaces of the redistribution material 32. The capacitors are arranged in the hexagonal-close-packed configuration described above with reference to the unit 42 of FIG. 2.

Figure 3A:
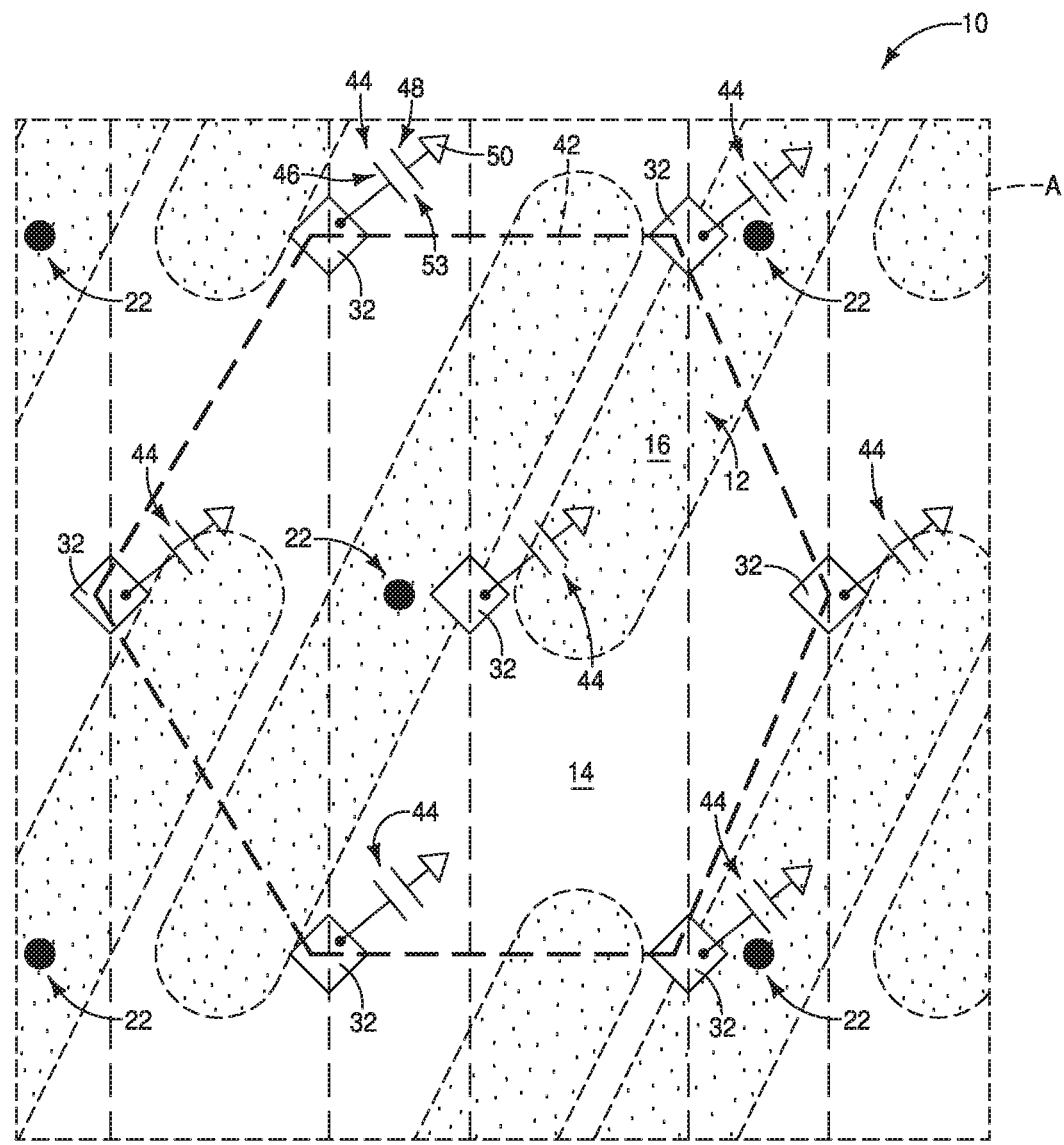
FIG. 3A is an enlarged top-down view of a region labeled "A" in FIG. 3.

FIG. 3A shows an enlarged view of a region "A" of FIG. 3 to assist the reader in visualizing the various features of FIG. 3. The capacitors 44 of FIG. 3A each comprise a pair of electrodes (nodes 46 and 48), with the electrode 46 being coupled to the redistribution material 32, and the electrode 48 being coupled with a reference voltage 50. The reference voltage is represented with a triangle. The reference voltage may be any suitable reference voltage; including, for example, ground, VCC/2, etc. Capacitor dielectric material 53 is between the electrodes 46 and 48. The capacitors 44 may have any suitable configuration. The capacitors are shown arranged in the hexagonal-close-packed-configuration 42 described above with reference to FIG. 3.

Figure 4:
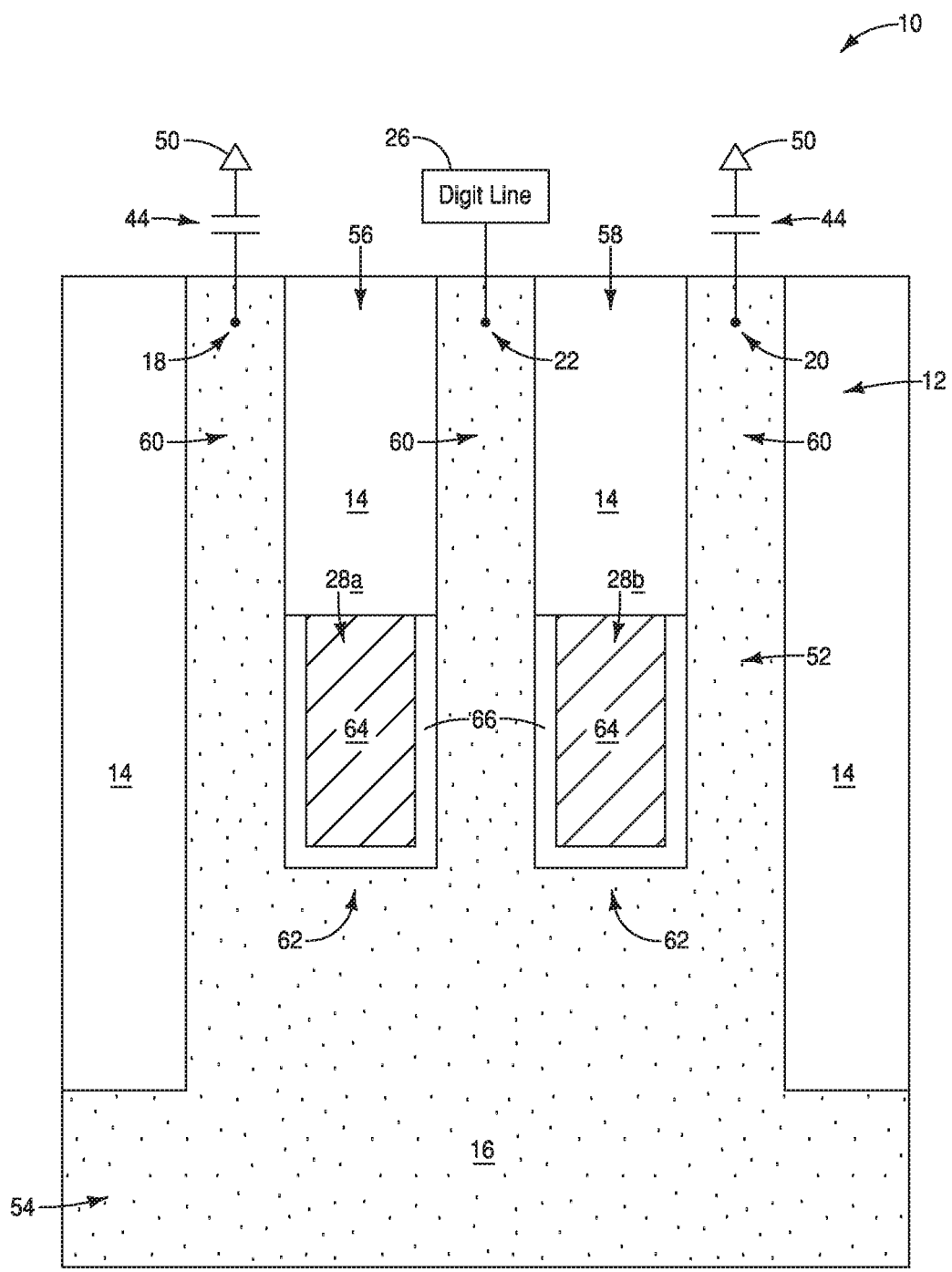
FIG. 4 is a diagrammatic cross-sectional side view along a line 4-4 of FIG. 3.

FIG. 4 shows a section along the line 4-4 of FIG. 3, and shows one of the active regions 12. The active region 12 includes a pillar 52 of the semiconductor material 16, with such pillar extending upwardly from a mass 54 of the semiconductor material. The pillar 52 may be referred to as a semiconductor pillar, or as a semiconductor-material-pillar.

The pillar 52 has two trenches 56 and 58 extending therein. The trenches 56 and 58 may be referred to as a first trench and a second trench, respectively. The digit-line-contact region 22 is within a segment of the pillar 52 between the trenches 56 and 58. The first and second capacitor-contact-regions 18 and 20 are along regions of the semiconductor pillar 52 which are outward of the trenches 56 and 58. The regions 18, 20 and 22 may correspond to conductively-doped source/drain regions 60 within upper portions of the semiconductor pillar 52. Channel regions 62 may be within the semiconductor material 16 along lower surfaces of the trenches 56 and 58.

The capacitor-contact-regions 18 and 20 are coupled with capacitors 44, and the digit-line-contact-region 22 is coupled with a digit line 26. The redistribution material 32 is not shown in FIG. 4 to simplify the drawing.

Wordlines 28a and 28b are within the trenches 56 and 58, respectively. The wordline 28a may be referred to as a first wordline, and the wordline 28b may be referred to as a second wordline. The wordlines 28a and 28b comprise conductive wordline material 64. The wordline material 64 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the wordlines 28a and 28b may comprise metal.

The wordline material 64 is a spaced from the semiconductor material 16 of the pillar 52 by insulative material (gate dielectric material) 66. Such insulative material may comprise any suitable composition(s), and in some embodiments may comprise, consist essentially of, or consist of silicon dioxide.

The first wordline 28a gatedly couples the first capacitor-contact-region 18 with the digit-line-contact-region 22, and the second wordline 28b gatedly couples the second capacitor-contact-region 20 with the digit-line-contact-region 22.

The term "gated coupling" is utilized to refer to the controlled coupling/decoupling of the source/drain regions (e.g., 20 and 22) that may be induced by electrical activation/deactivation of a wordline 28.

Figure 5:
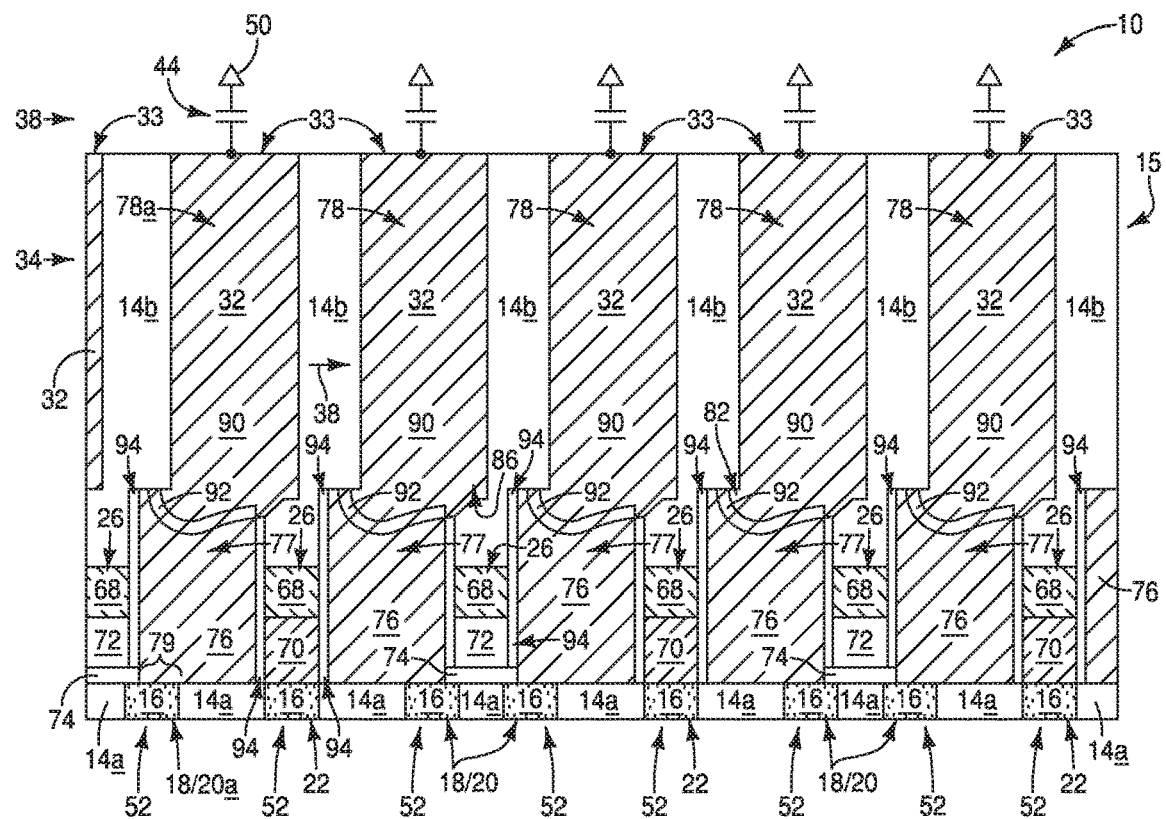
FIGS. 5 and 6 are diagrammatic cross-sectional side views along directions labeled "5" and "6" of FIGS. 2 and 3.
Figure 6:
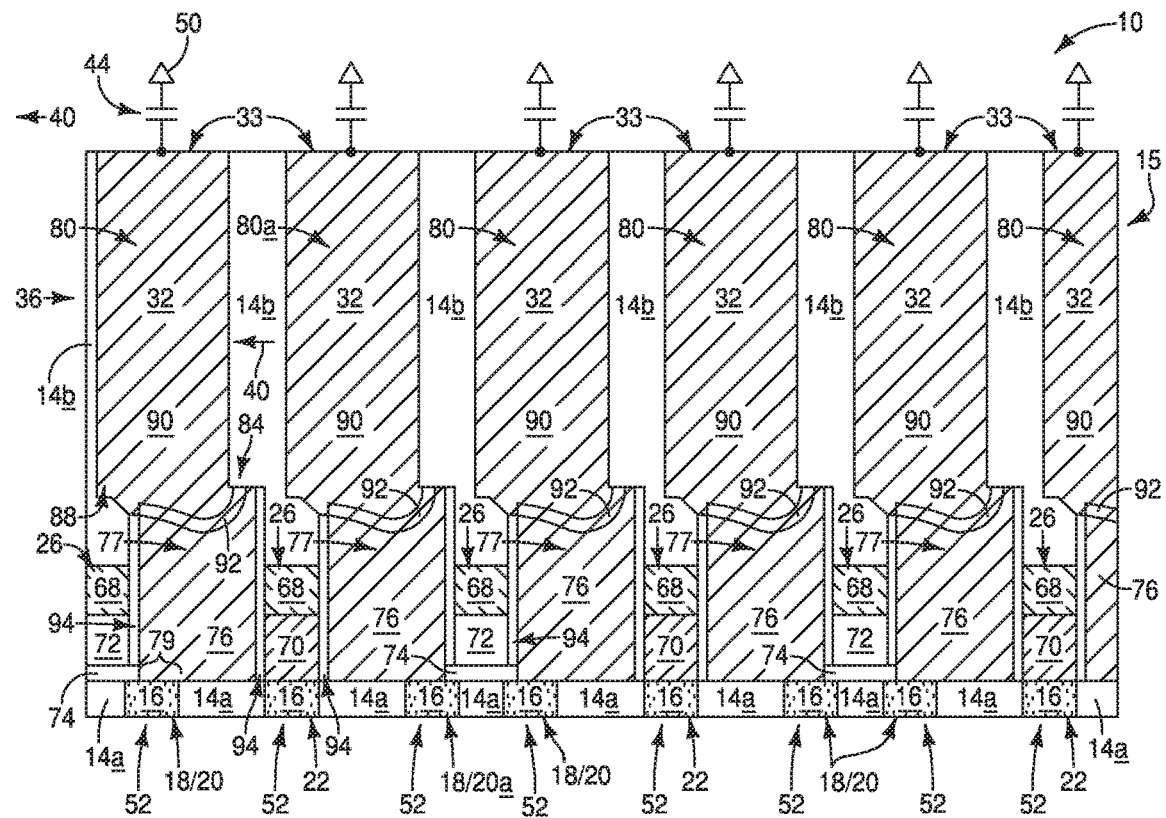

FIGS. 5 and 6 diagrammatically illustrate cross-sections along the directions "5" and "6" of FIGS. 2 and 3, and show example configurations of the redistribution material 32. FIGS. 5 and 6 show upper regions of the semiconductor-material-pillars 52 described above with reference to FIG. 4, and specifically show the capacitor-contact-regions 18/20 and the digit-line-contact regions 22. The regions 18/20 are spaced from the regions 22 by intervening regions comprising the insulative material 14 (labeled 14a in FIGS. 5 and 6). The pillars 52 of FIGS. 5 and 6 would comprise the trenches 58 and channel regions 62 described above with reference to FIG. 4, but such segments of the pillars are not shown in FIGS. 5 and 6 to simplify the drawings.

Digit lines 26 extend in and out of the page relative to the cross-sections of FIGS. 5 and 6. The digit lines 26 comprise conductive digit line material 68. The digit line material 68 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the digit lines 26 may comprise metal.

Some of the digit lines 26 are directly over digit-line-contact-regions 22 along the cross-sections of FIGS. 5 and 6, and such digit lines are electrically coupled to the underlying digit-line-contact-regions 22 through conductive interconnecting material 70. The interconnecting material 70 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the interconnecting material 70 may comprise conductively-doped semiconductor material (e.g., conductively-doped silicon).

Some of the digit lines 26 pass across underlying capacitor-contact-regions 18/20 along the cross-sections of FIGS. 5 and 6. Such digit lines are vertically spaced from the underlying capacitor-contact-regions by insulative materials 72 and 74. The insulative materials 72 and 74 may comprise any suitable composition(s); and may comprise the same composition as one another, or may comprise different compositions relative to one another. In some embodiments, the insulative materials 72 and 74 may comprise one or more of silicon dioxide, silicon nitride, aluminum oxide, etc.

In some embodiments, the digit-line-contact-regions 22 and the capacitor-contact-regions 18/20 may be considered to be arranged in the array 24 described above with reference to FIGS. 2 and 3. Each of the digit-line-contact-regions 22 may be considered to be between a pair of the capacitor-contact-regions 18/20, as shown in FIG. 4. The conductive redistribution material 32 is electrically coupled with the capacitor-contact-regions through conductive interconnecting material 76. The interconnecting material 76 may comprise the same conductive materials described above with reference to the interconnecting material 70. The interconnecting materials 70 and 76 may be referred to as first and second interconnecting materials to distinguish them from one another. The interconnecting materials 70 and 76 may comprise the same composition as one another, or may comprise different compositions relative to one another. In some embodiments, the interconnecting materials 70 and 76 may both comprise, consist essentially of, or consist of conductively-doped semiconductor material (e.g., conductively-doped silicon).

The interconnecting material 76 may be considered to be configured as conductive plugs 77. The conductive plugs 77 have segments 79 which are directly over underlying capacitor-contact-regions 18/20.

FIG. 5 is a cross-section along one of the first rows 34 of FIGS. 2 and 3, and FIG. 6 is a cross-section along one of the second rows 36 of FIGS. 2 and 3. The conductive redistribution material 32 is configured as first structures 78 along the cross-section of FIG. 5, and is configured as second structures 80 along the cross-section of FIG. 6. The first structures 78 are offset from underlying capacitor-contact-regions 18/20 along the first direction represented by the arrow 38, and the second structures 80 are offset from the underlying capacitor-contact-regions 18/20 along the second direction represented by the arrow 40. For instance, one of the structures 78 of FIG. 5 is identified with the label 78a, and is shown to be electrically coupled with an underlying capacitor-contact-region labeled 18/20a. The structure 78a extends upwardly and laterally outwardly from the capacitor-contact-region 18/20a, and is laterally offset from the capacitor-contact-region 18/20a along the first direction 38. Similarly, one of the structures 80 of FIG. 6 is identified with the label 80a and is shown to be electrically coupled with an underlying capacitor-contact-region labeled 18/20a. The structure 80a extends upwardly and laterally outwardly from the underlying capacitor-contact-region 18/20a, and is laterally offset from the underlying capacitor-contact-region 18/20a along the second direction 40.

In some embodiments, the first direction 38 may be considered to be substantially along the first row 34 of FIG. 5, and the second direction 40 may be considered to be substantially along the second row 36 of FIG. 6. The term "substantially along" means "coextensive with" to within reasonable tolerances of fabrication and measurement. The second direction 40 is substantially opposite to the first direction. 38, with the term "substantially opposite" meaning opposite to within reasonable tolerances of fabrication and measurement.

The conductive redistribution material 32 of FIGS. 5 and 6 has upper surfaces 33, and the capacitors 44 are electrically coupled with such upper surfaces.

In the illustrated embodiment, the structures 78 and 80 of the conductive redistribution material 32 are boot-shaped structures along the cross-sections of FIGS. 5 and 6. The structures 78 may be referred to as first boot-shaped structures, and the structures 80 may be referred to as second boot-shaped structures. Each of the first boot-shaped structures 78 has a toe region 82 extending into an associated conductive plug 77, and similarly each of the second boot-shaped structures 80 has a toe region 84 extending into an associated conductive plug 77. Also, each of the first boot-shaped structures 78 has a heel region 86 directly over a portion of a digit line 26, and each of the second boot-shaped structures 80 has a heel region 88 directly over a portion of a digit line 26. In some embodiments, the heel regions of the structures 78 and 80 may be considered to be above the digit lines 26, and to partially overlap (i.e., partially laterally overlap) the digit lines.

The illustrated boot-shaped structures 78 and 80 each comprises a first material 90 and a second material 92, with such first and second materials 90 and 92 together being the redistribution material 32. The materials 90 and 92 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the material 90 is a composition containing one or more metals. For instance, the material 90 may comprise, consist essentially of, or consist of one or both of tungsten and titanium. In some embodiments, the material 92 comprises metal silicide. For instance, the material 92 may comprise, consist essentially of, or consist of one or more of CoSi, WSi and TiSi; where the chemical formulas indicate primary constituents rather than specific stoichiometries. In some embodiments, the material 92 may be referred to as comprising, consisting essentially of, or consisting of one or more of cobalt silicide, tungsten silicide and titanium silicide. In some embodiments (discussed below the reference to FIGS. 23 and 24) the redistribution material 32 may further comprise a metal nitride liner, with example metal nitride liners comprising, consisting essentially of, or consisting of one or both of titanium nitride and tungsten nitride.

Referring still to FIGS. 5 and 6, the first boot-shaped structures 78 are substantially mirror images of the second-shaped structures 80, with the term "substantial mirror image" meaning a mirror image to within reasonable tolerances of fabrication and measurement.

Insulative material 14b (e.g., silicon nitride) is laterally between the structures 78 along the cross-section of FIG. 5, and is laterally between the structures 80 along the cross-section of FIG. 6. In some embodiments, the insulative material 14b may be considered to be configured as an insulative mass 15 which is over the digit lines 26 and the conductive plugs 77. The structures 78 and 80 may be considered to extend downwardly through the insulative mass 15 and into the conductive plugs 77. In some embodiments, the insulative material 14b may be the same as the insulative material 14a (e.g., both may comprise, consist essentially of, or consist of silicon dioxide). In other embodiments, the insulative material 14b may be different than the insulative material 14a. For instance, in some embodiments the insulative material 14b may comprise, consist essentially of, or consist of silicon nitride, while the insulative material 14a comprises silicon dioxide.

In the illustrated embodiment, insulative liners 94 are shown to be adjacent the conductive plugs 77, and to space such conductive plugs from the digit lines 26. The boot-shaped structures 78 and 80 extend into every other one of the insulative liners 94 along the cross-sections of FIGS. 5 and 6.

The insulative liners 94 may comprise any suitable composition(s); and in some embodiments may comprise one or more of silicon dioxide, silicon nitride, aluminum oxide, void regions (gas-filled regions), etc.

The configurations of FIGS. 2-6 may be formed with any suitable methods. An example method is described with reference to FIGS. 7-22.

Figure 7:
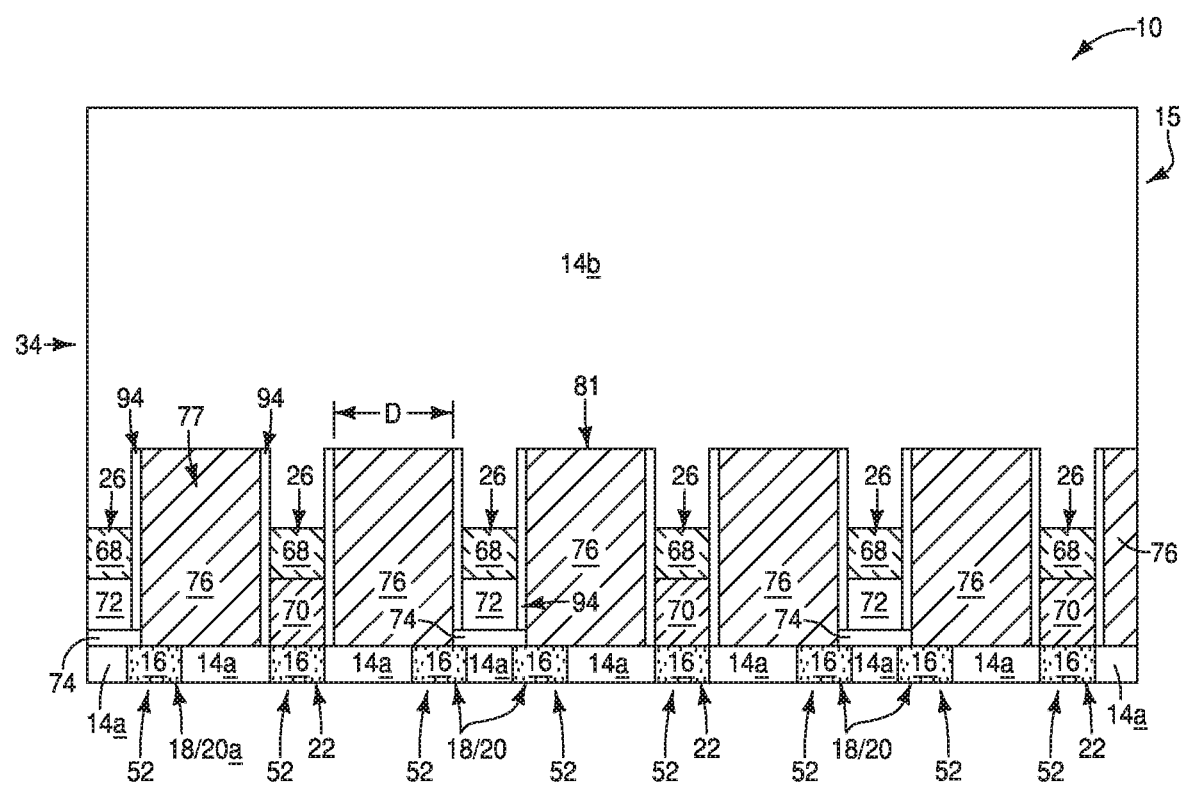
FIGS. 7 and 8 are diagrammatic cross-sectional side views along the same cross-sections as FIGS. 5 and 6 at an example process stage of an example method.
Figure 8:
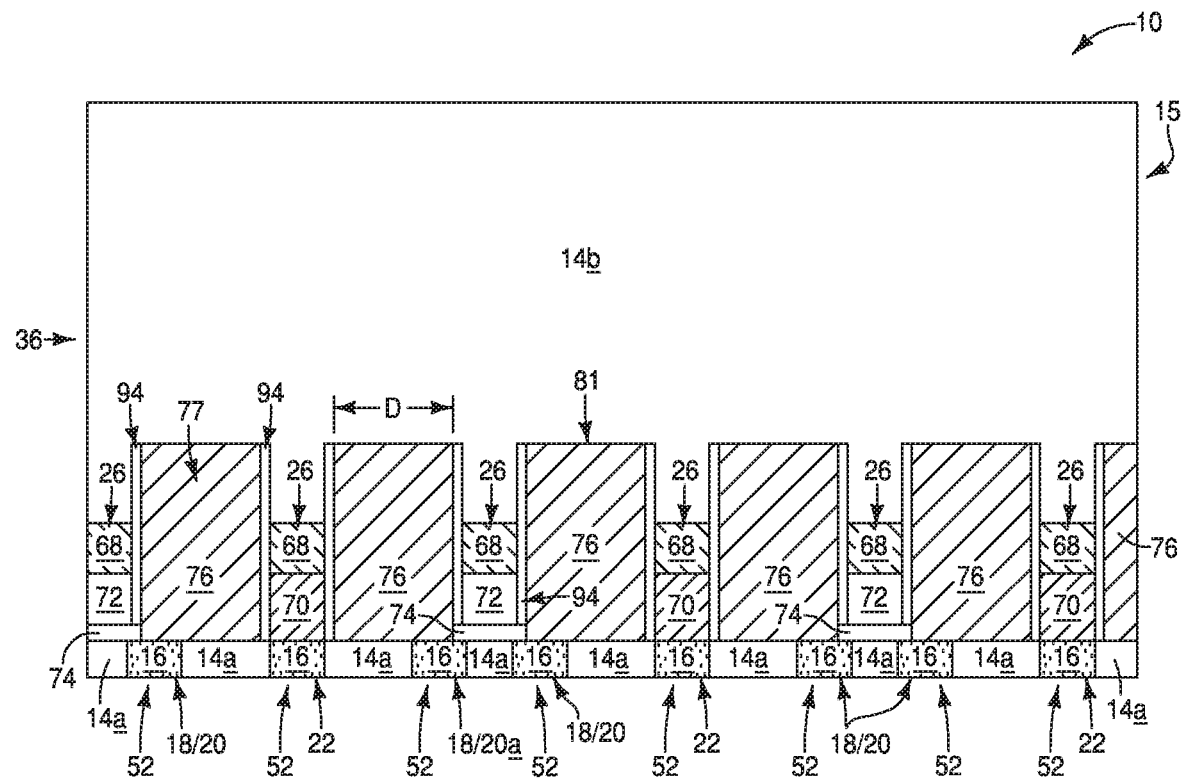

Referring to FIGS. 7 and 8, the assembly 10 is shown along the rows 34 and 36, respectively. The region of the assembly 10 of FIGS. 7 and 8 may be considered to be a construction which is formed to have the semiconductor-material-pillars 52 (analogous to the pillars 52 of FIG. 4). The pillars 52 comprise the digit-line-contact regions 22 and the capacitor-contact-regions 18/20. The regions 22 and 18/20 may be within an array analogous to the array 24 of FIGS. 2 and 3. Such array has the alternating first and second rows 34 and 36. The capacitor-contact-regions 18/20 are spaced from the digit-line-contact-regions 22 along such rows by the insulative material 14a.

The construction of FIGS. 7 and 8 includes the digit lines 26, with some of the digit lines being directly over the digit-line-contact-regions 22 along the cross-sections of FIGS. 7 and 8.

The construction of FIGS. 7 and 8 also includes the conductive plugs 77, and the spacers 94 between the conductive plugs 77 and the digit lines 26. The conductive plugs 77 have lateral dimensions corresponding to a dimension D along the cross-sections of FIGS. 7 and 8. The dimension D may be any suitable dimension, and in some embodiments may be within a range of from about 10 nm to about 300 nm. The conductive plugs 77 may be considered to have upper surfaces 81 along the cross-sections of FIGS. 7 and 8, with such upper surfaces having first dimensions corresponding to the dimension D.

In some embodiments, the cross-sections of FIGS. 7 and 8 may be considered to be first and second cross-sections through the assembly 10 with the first cross-section of FIG. 7 being along one of the first rows 34, and the second cross-section of FIG. 8 being along one of the second rows 36.

The insulative mass 15 is shown to be over the digit lines 26 and the conductive plugs 77, with such insulative mass comprising the insulative material 14b.

Figure 9:
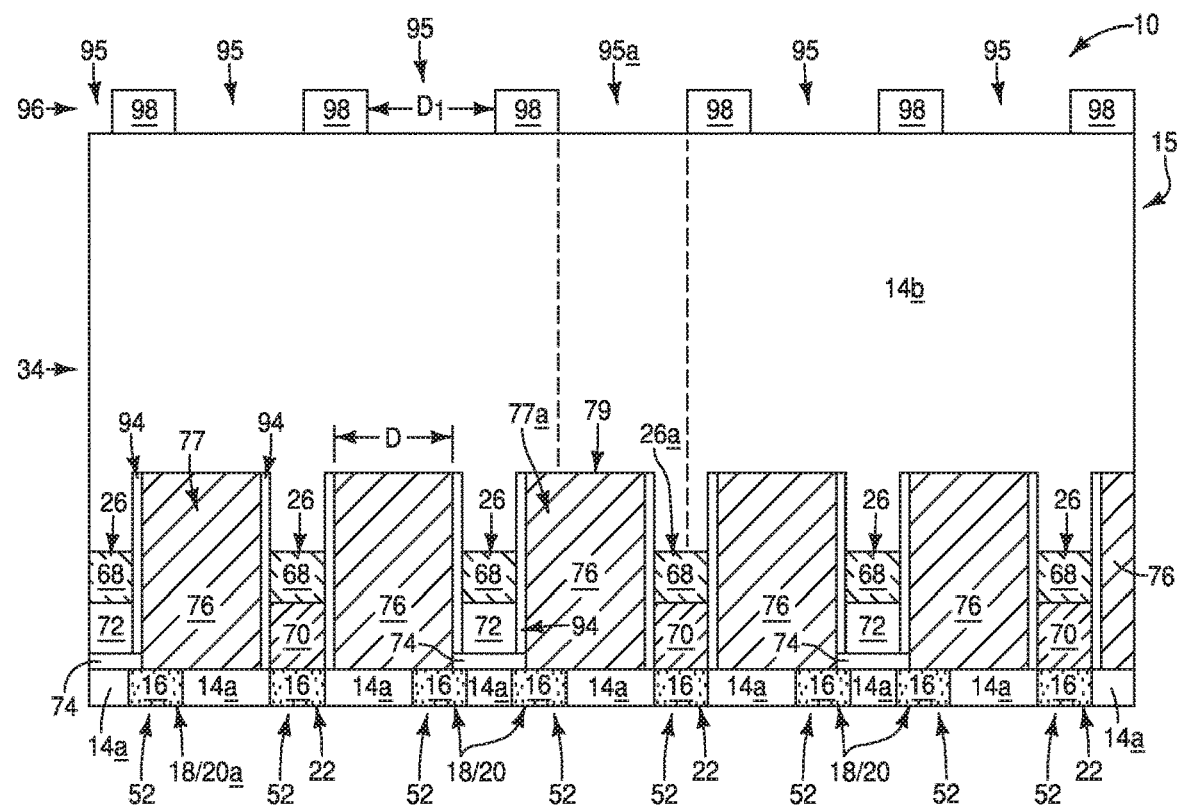
FIGS. 9 and 10 are diagrammatic cross-sectional side views along the same cross-sections as FIGS. 7 and 8 at an example process stage subsequent to that of FIGS. 7 and 8.
Figure 10:
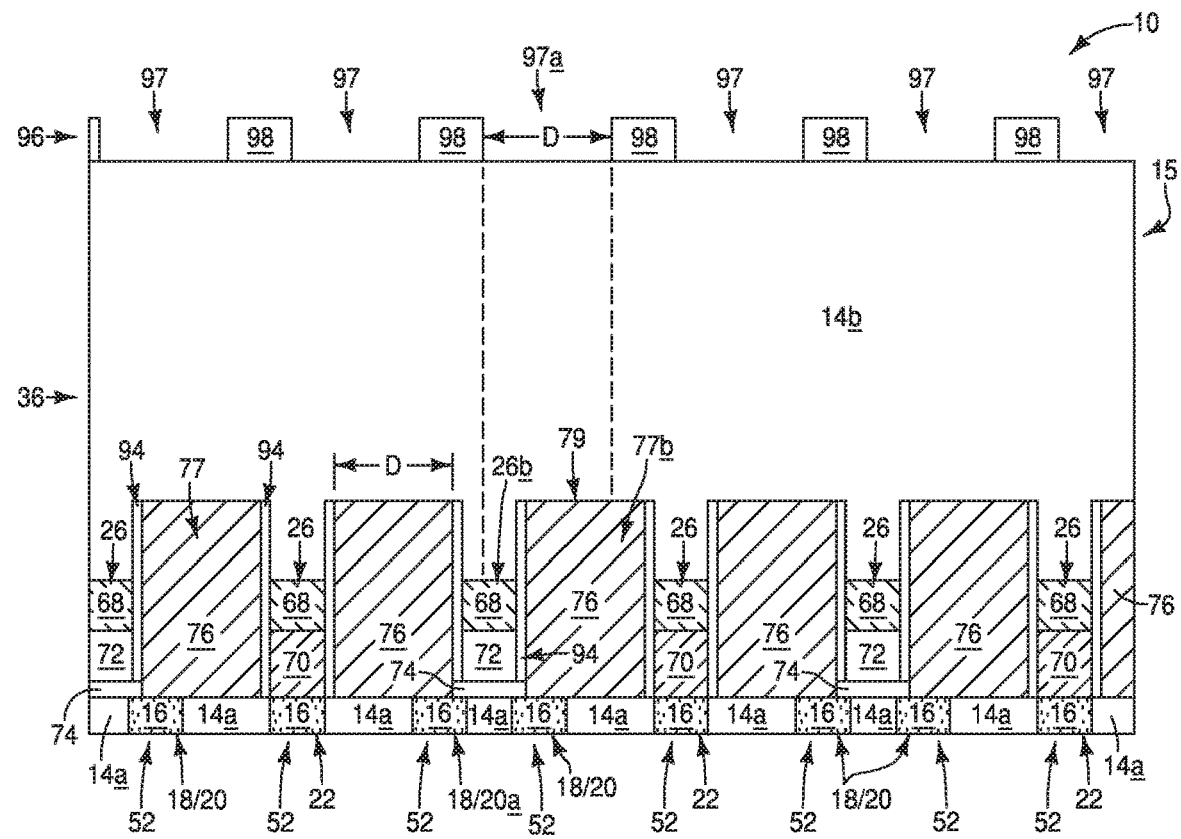

Referring to FIGS. 9 and 10, a patterned mask 96 is formed over the insulative mass 15. The patterned mask comprises a masking material 98. The patterned mask 96 may comprise any suitable patterned material, and in some embodiments may comprise photolithographically-patterned photoresist 98.

The patterned mask 96 has first openings 95 extending therethrough along the first cross-section of FIG. 9, and has second openings 97 extending therethrough along the second cross-section of FIG. 10. The first and second openings 95 and 97 are aligned such that each of such openings partially overlaps one of the conductive plugs 77 and a digit line adjacent to the conductive plug. For instance, one of the openings 95 is labeled as 95a and is shown to partially overlap a conductive plug labeled 77a, and a digit line (labeled 26a) which is adjacent to the conductive plug 77a. Similarly, one of the openings 97 is labeled 97a and is shown to partially overlap a conductive plug 77b and a digit line (labeled 26b) which is adjacent to the conductive plug 77b.

The openings 95 and 97 are shown to have a dimension $D_1$ along the cross-sections of FIGS. 9 and 10. The dimension $D_1$ may be about the same as the dimension D of the plugs 77 in some embodiments, or may be different than the dimensions D of the plugs 77.

Figure 11:
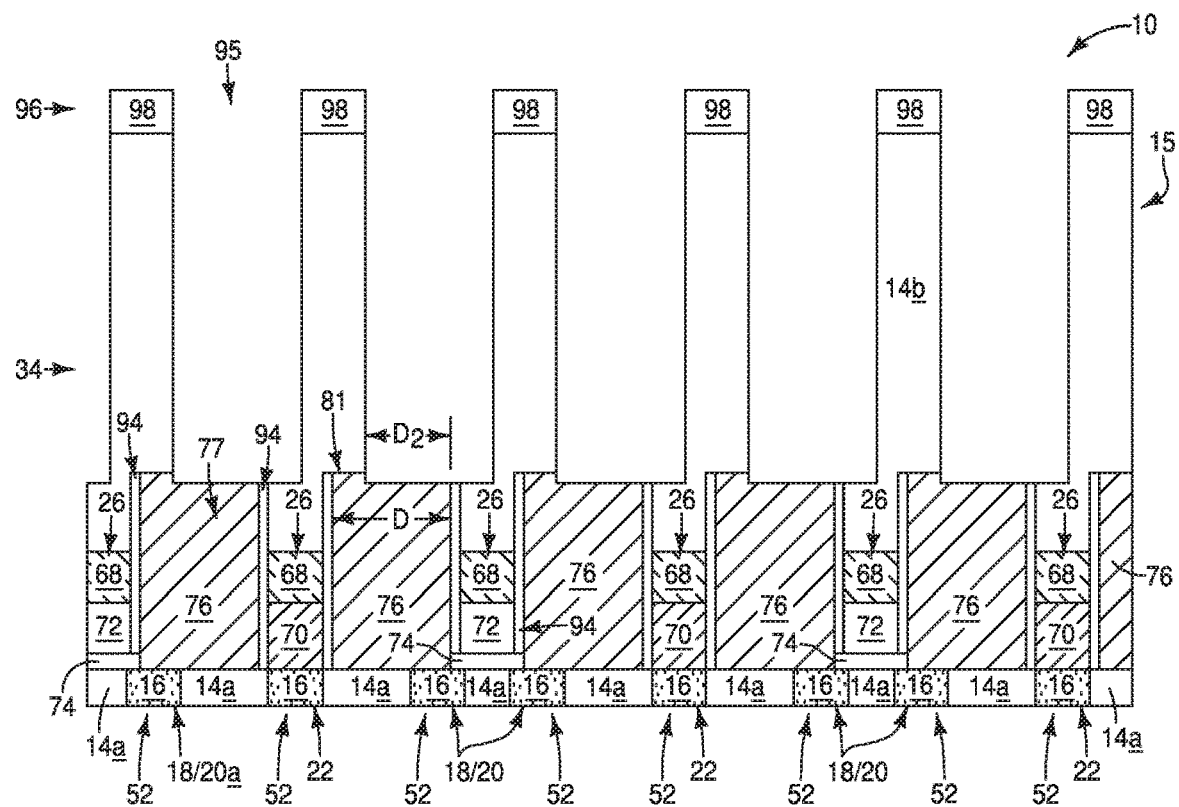
FIGS. 11 and 12 are diagrammatic cross-sectional side views along the same cross-sections as FIGS. 7 and 8 at an example process stage subsequent to that of FIGS. 9 and 10.
Figure 12:
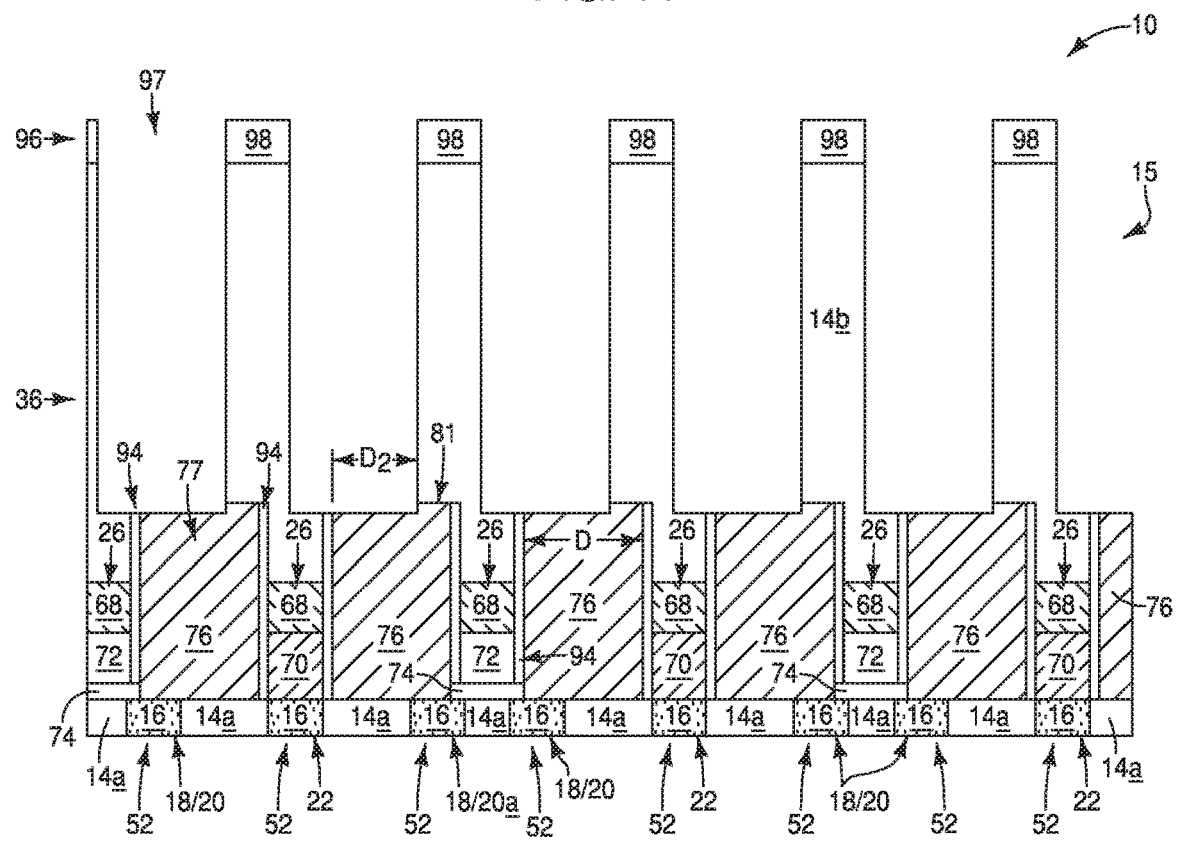

Referring to FIGS. 11 and 12, the openings 95 and 97 are extended downwardly to the conductive plugs 77 with a first etch. In some embodiments, the insulative material 14b comprises silicon nitride, and the etch of FIGS. 11 and 12 is an anisotropic etch (or at least an etch which is primarily anisotropic), with the etch being suitable for penetrating through the silicon nitride. In the shown embodiment, the etch also penetrates partially into the conductive plugs 77, and partially into the liners 94.

The openings 95 and 97 overlap the first dimensions of the plugs 77 (i.e., the dimension D) by an amount $D_2$. In some embodiments, the amount $D_2$ may be within a range of from about 20% to about 80% of the dimension D.

Figure 13:
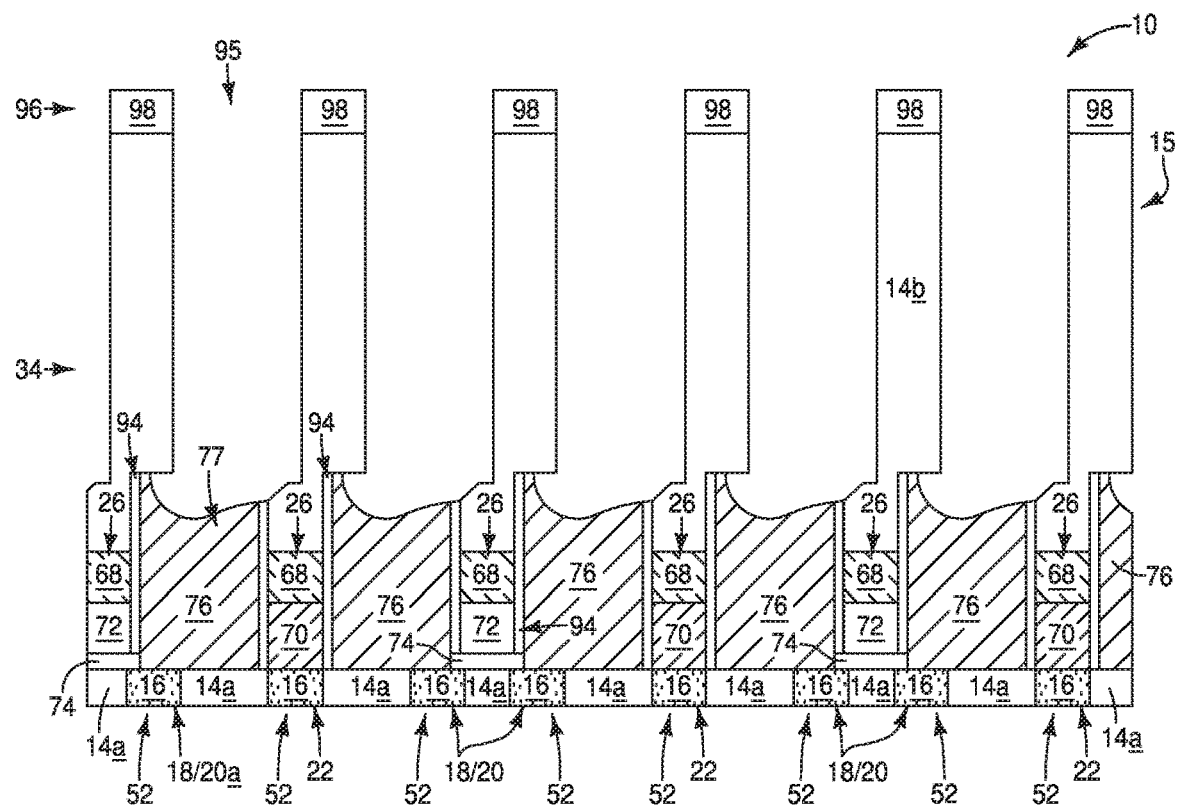
FIGS. 13 and 14 are diagrammatic cross-sectional side views along the same cross-sections as FIGS. 7 and 8 at an example process stage subsequent to that of FIGS. 11 and 12.
Figure 14:
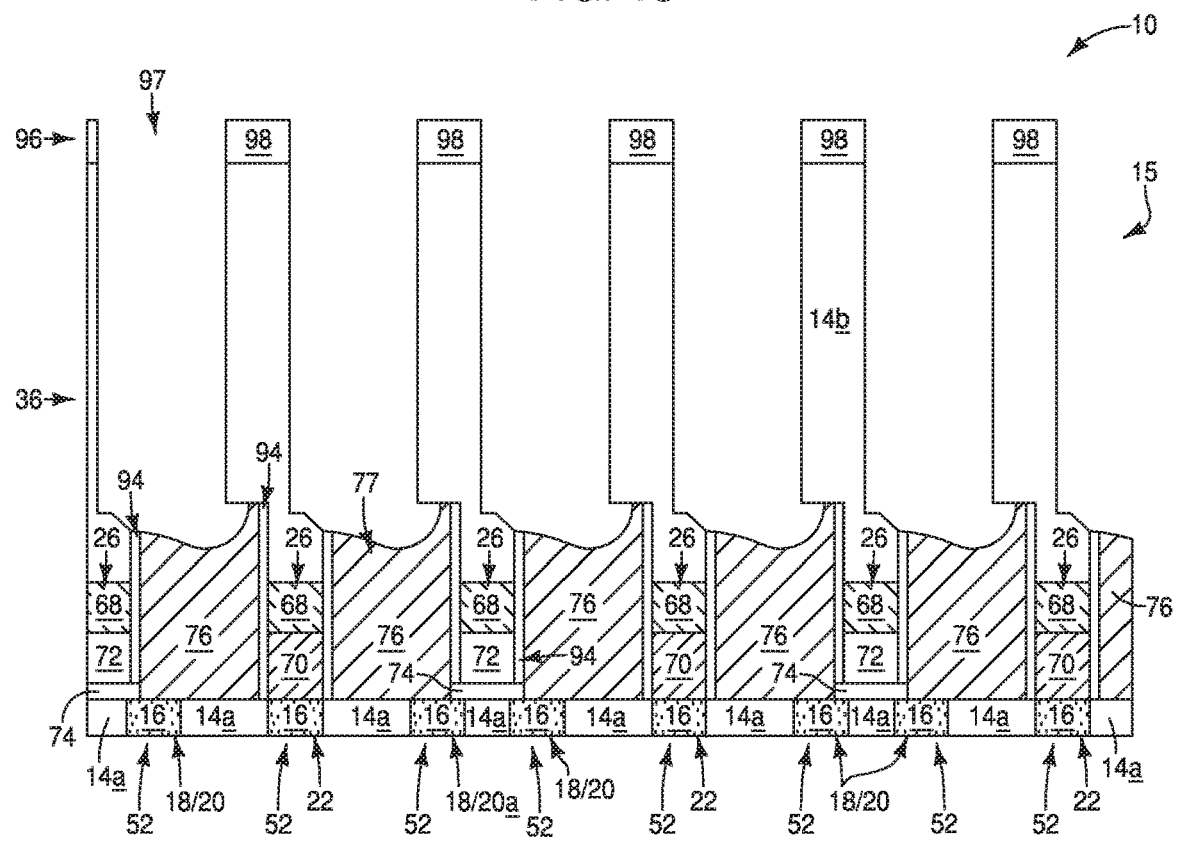

Referring to FIGS. 13 and 14, the first and second openings 95 and 97 are extended sideways into the conductive plugs 77 with a second etch. In some embodiments, the second etch may be an isotropic etch (or at least a primarily isotropic etch) which is selective for the silicon 76 of the plugs 77 relative to the materials of the spacers 94, the mass 15, and the mask 96. For purposes of interpreting this disclosure and the claims that follow, an etch is considered to be selective for a first material relative to a second material if the etch removes the first material faster than the second material; which can include, but which is not limited to, etches which are 100% selective for the first material relative to the second material.

The first and second openings 95 and 97 may be considered to have first and second shapes, respectively, at the process stage of FIGS. 13 and 14. The second shape of the openings 97 is substantially a mirror image of the first shape of the openings 95. In the illustrated embodiment, the first and second shapes of the openings 95 and 97 are boot shapes, with toes of the boots extending into the conductive plugs 77.

Figure 15:
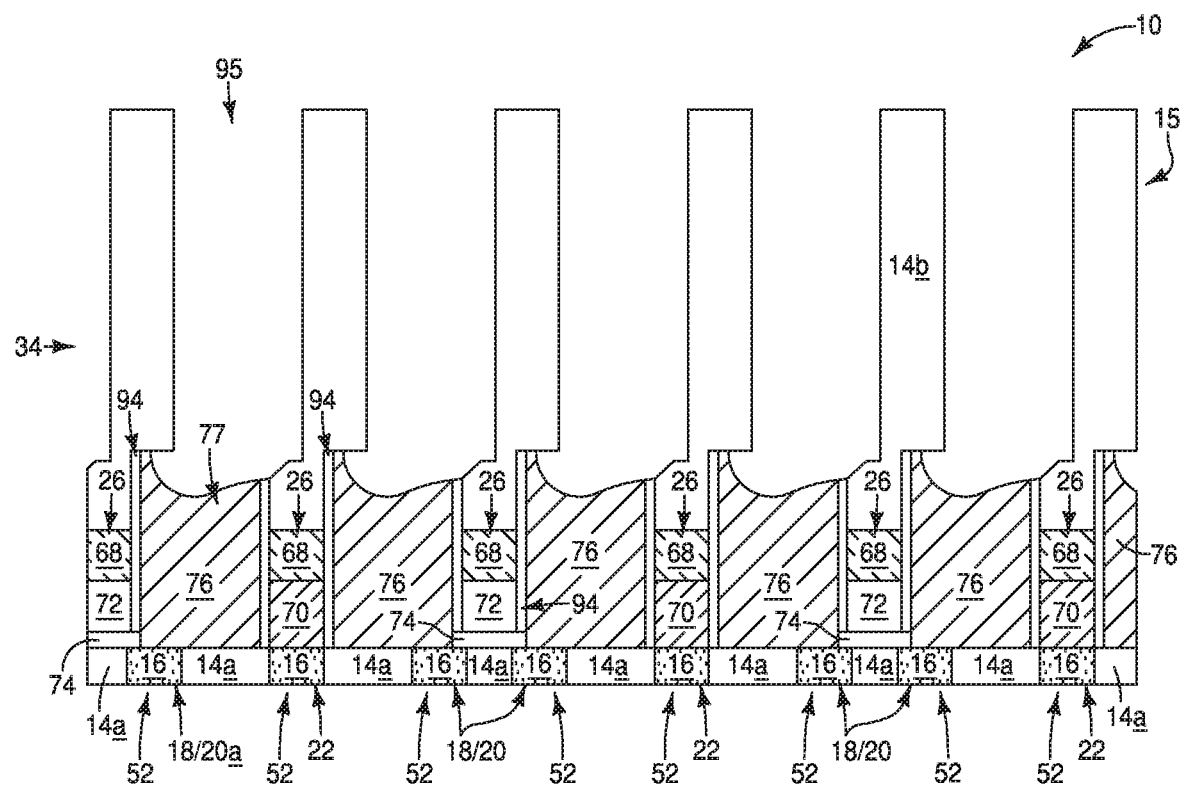
FIGS. 15 and 16 are diagrammatic cross-sectional side views along the same cross-sections as FIGS. 7 and 8 at an example process stage subsequent to that of FIGS. 13 and 14.
Figure 16:
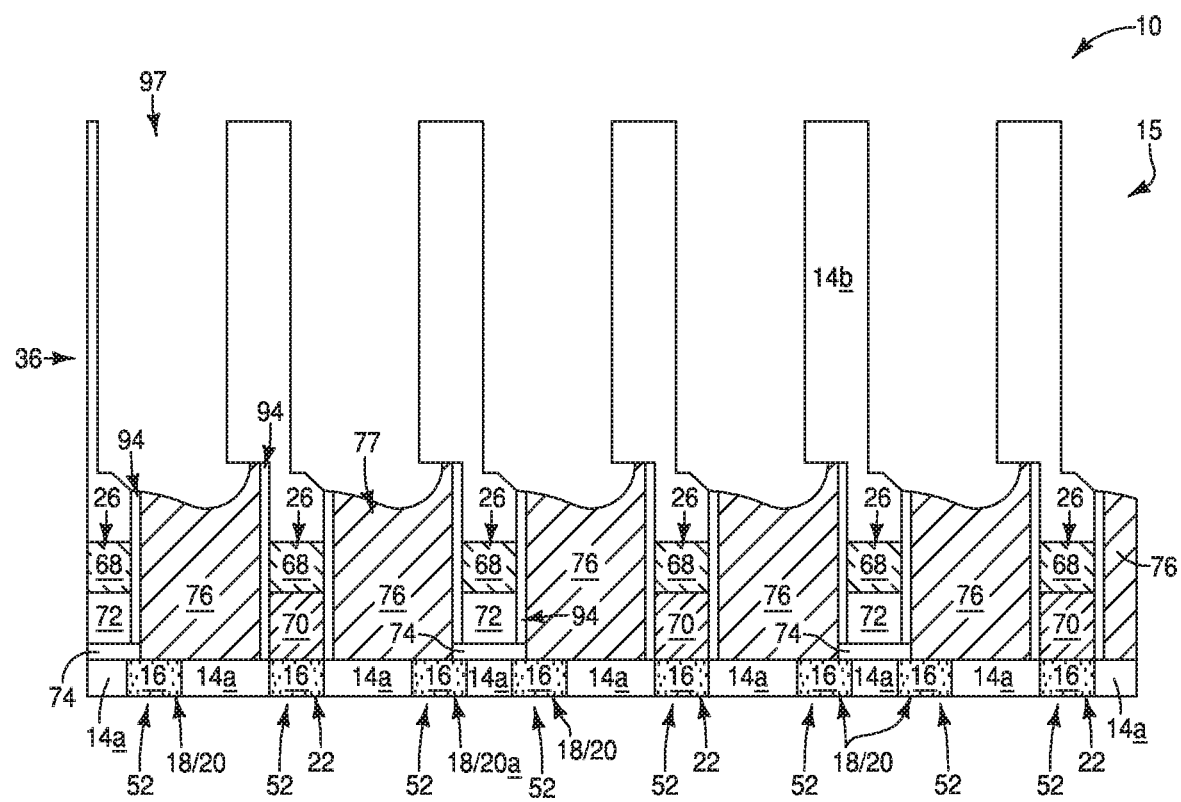

Referring to FIGS. 15 and 16, the masking material 98 (FIGS. 13 and 14) is removed.

In some embodiments, the semiconductor material 16 may comprise conductively-doped silicon, and an oxide (silicon dioxide)) may form across exposed upper surface of such silicon. Such oxide may be removed from along the upper surface with an appropriate cleaning step (e.g., an etch utilizing hydrofluoric acid).

Figure 17:
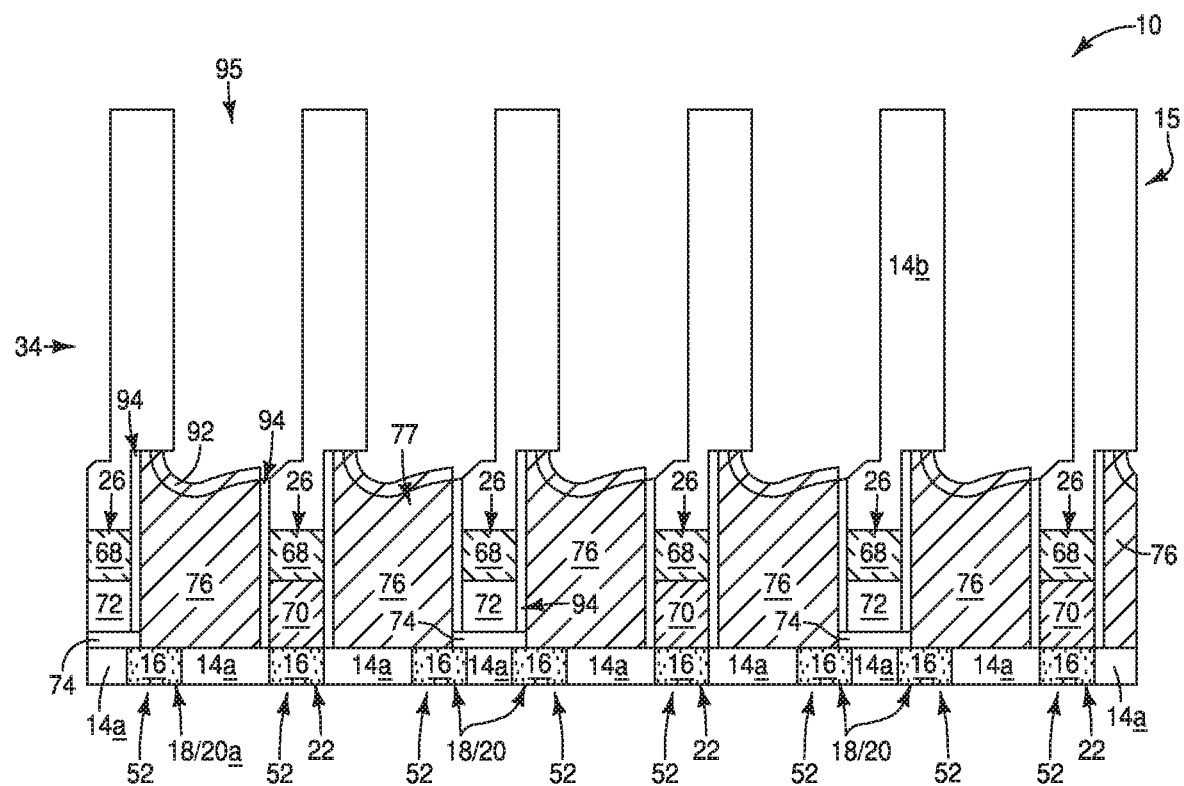
FIGS. 17 and 18 are diagrammatic cross-sectional side views along the same cross-sections as FIGS. 7 and 8 at an example process stage subsequent to that of FIGS. 15 and 16.
Figure 18:
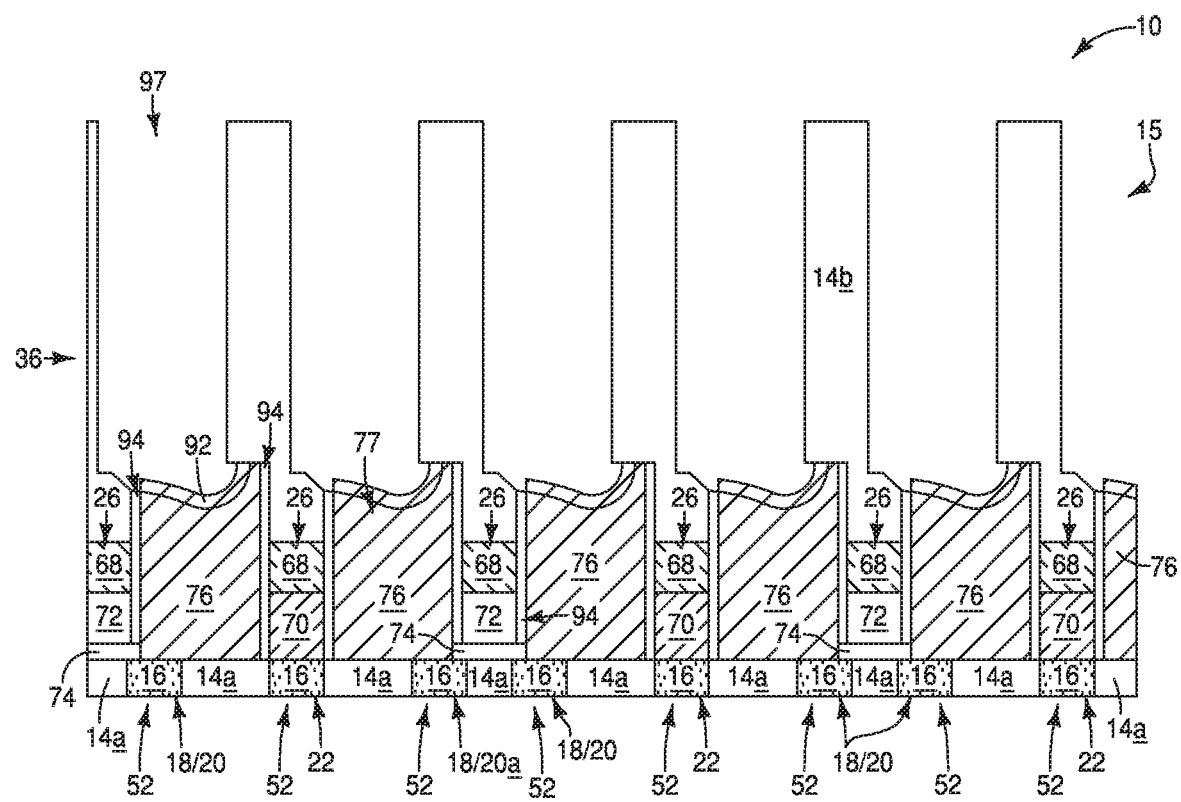

Referring to FIGS. 17 and 18, metal silicide 92 is formed along exposed upper surfaces of the conductive material 76 of the plugs 77. In some embodiments, the conductive material 76 may comprise conductively-doped silicon, and the metal silicide 92 may be formed by appropriate reaction of one or more metals with the silicon of the material 76. Alternatively, or additionally, the metal silicide 92 may be formed using, for example, one or more of atomic layer deposition, chemical vapor deposition and physical vapor deposition. The metal silicide 92 may comprise any suitable composition(s); and in some embodiments may comprise, consist essentially of, or consist of one or more of cobalt silicide, tungsten silicide and titanium silicide.

Figure 19:
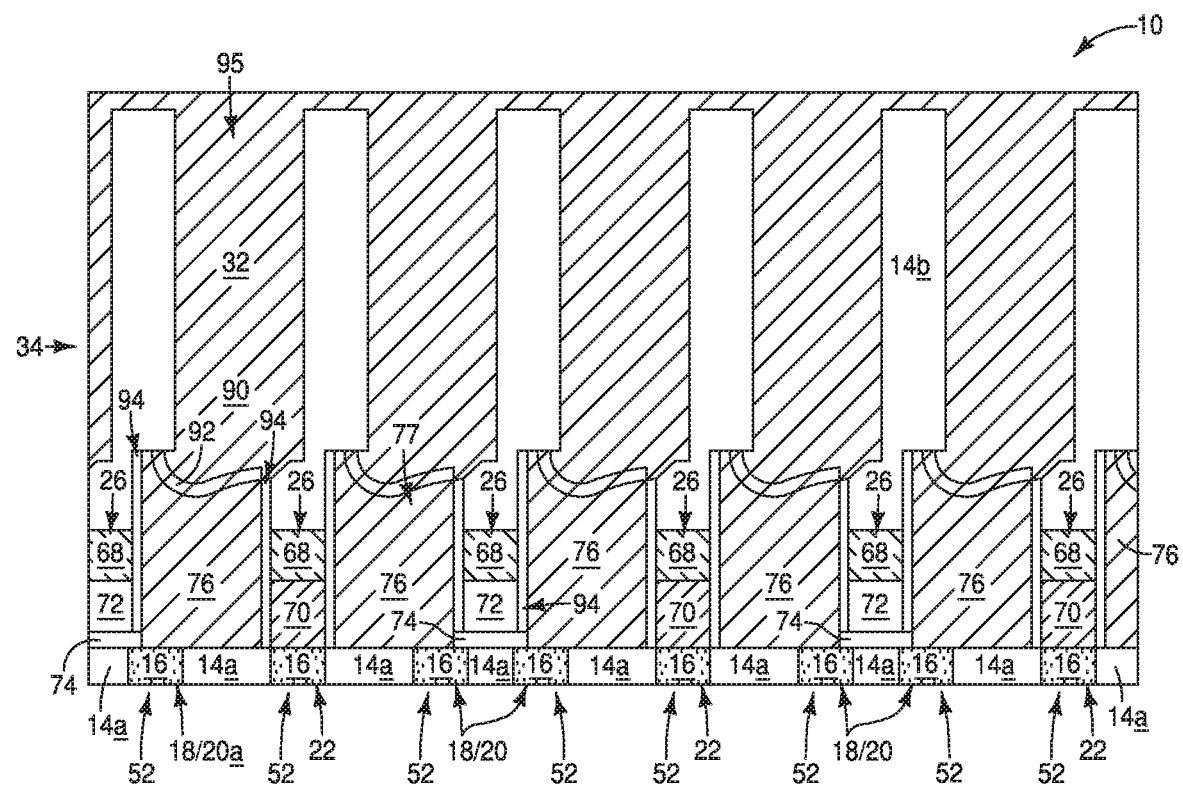
FIGS. 19 and 20 are diagrammatic cross-sectional side views along the same cross-sections as FIGS. 7 and 8 at an example process stage subsequent to that of FIGS. 17 and 18.
Figure 20:
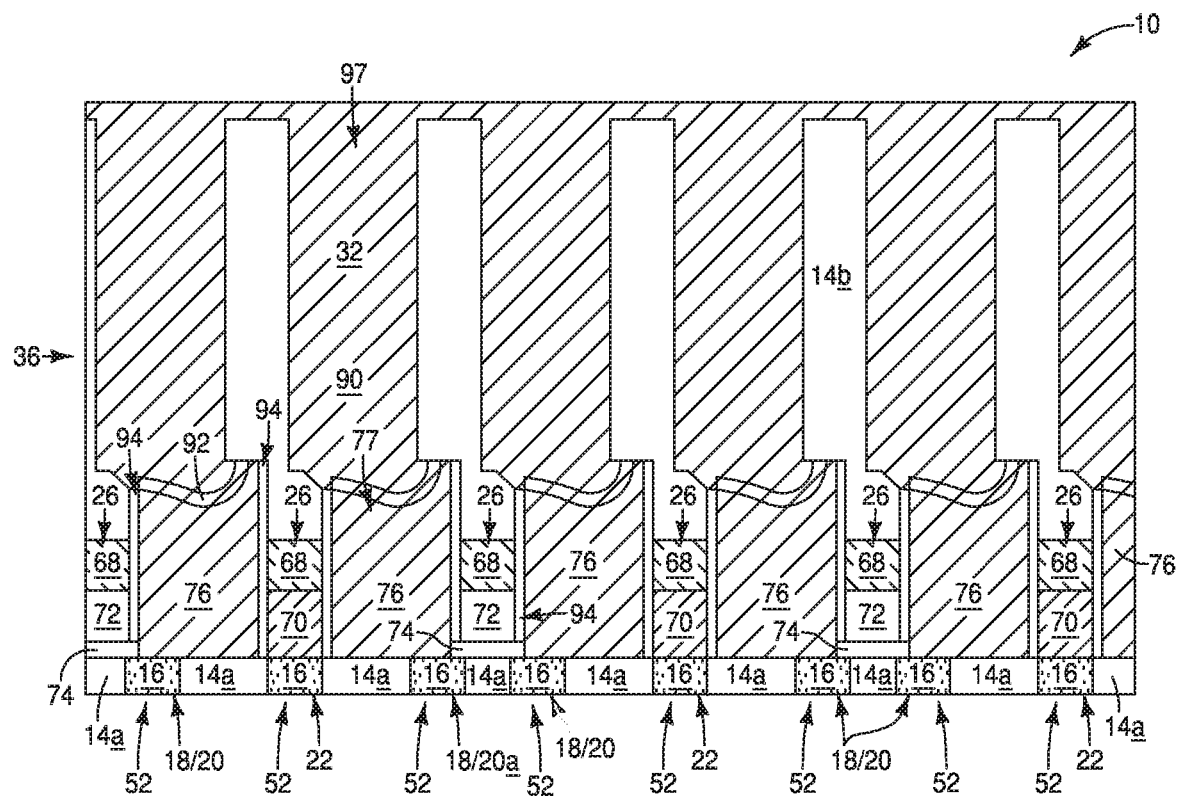

Referring to FIGS. 19 and 20, the conductive material 90 is formed within the openings 95 and 97 to fill such openings. In the illustrated embodiment, the conductive material 90 overfills the openings 95 and 97, and extends across upper surfaces of the insulative material 14b. The material 90 may comprise, consist essentially of, or consist of metal. In some embodiments, the conductive material 90 may comprise, consist essentially of, or consist of one or both of titanium and tungsten.

The materials 90 and 92 together form the redistribution material 32. Accordingly, the redistribution material 32 may be considered to be formed within the openings 95 and 97 utilizing the process stages of FIGS. 17-20.

Figure 21:
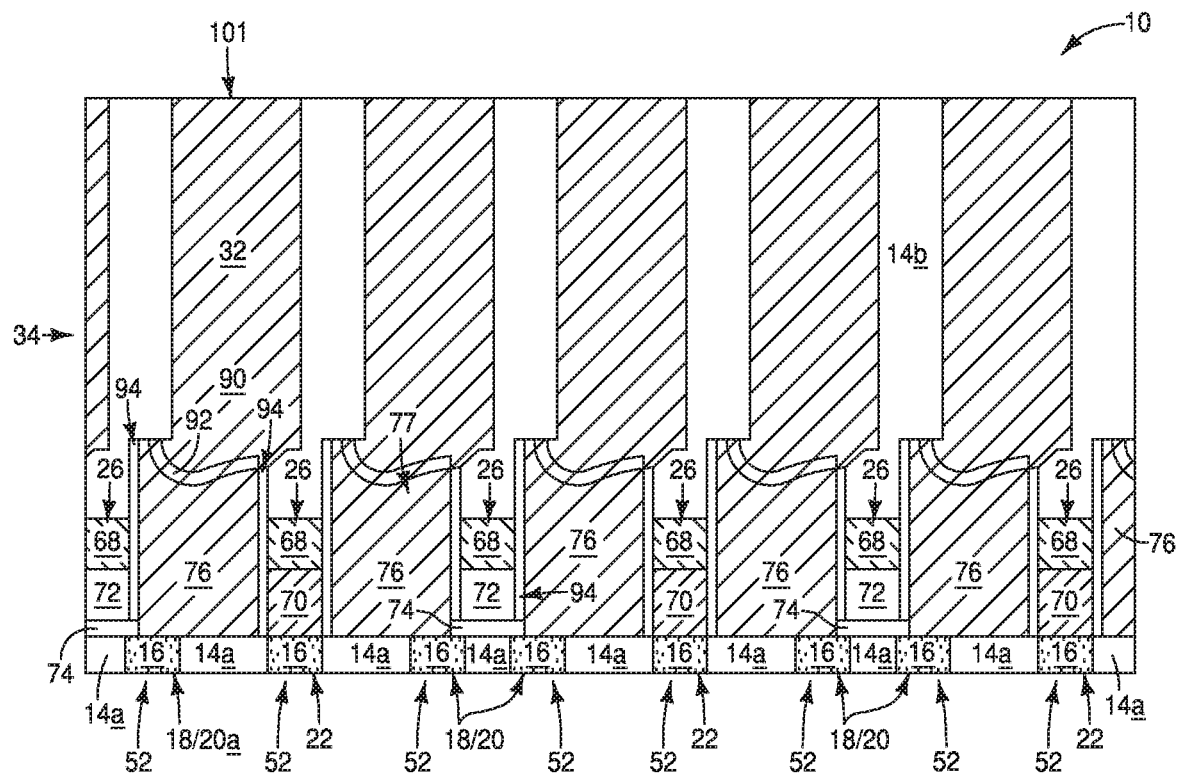
FIGS. 21 and 22 are diagrammatic cross-sectional side views along the same cross-sections as FIGS. 7 and 8 at an example process stage subsequent to that of FIGS. 19 and 20.
Figure 22:
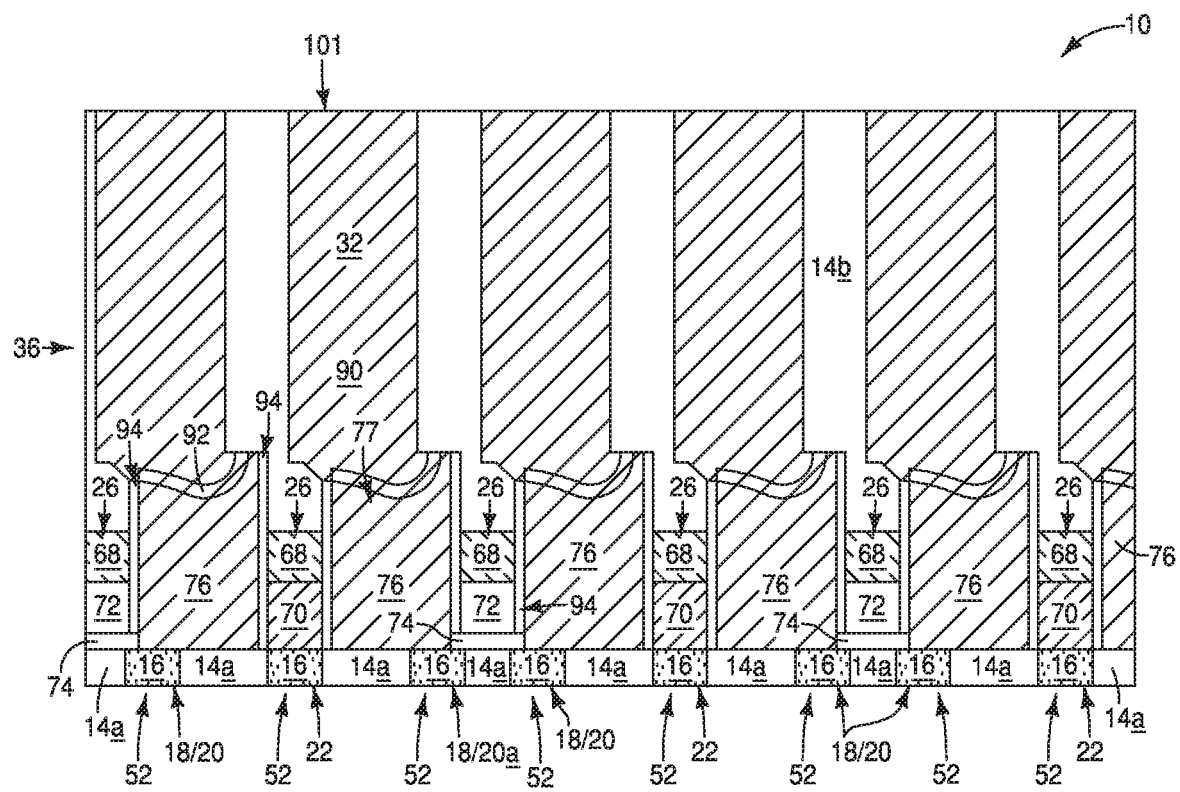

Referring to FIGS. 21 and 22, the assembly 10 is subjected to planarization (e.g., chemical-mechanical polishing, CMP) to remove excess conductive material 90 from over upper surfaces of the insulative material 14b and form a planarized surface 101. The planarized surface 101 extends across the materials 90 and 14b. In subsequent processing, capacitors may be formed over the surface 101 and coupled with the redistribution material 32 to form the integrated assembly described above with reference to FIGS. 5 and 6. The capacitors may be substantially arranged in a hexagonal-close-packed-configuration 42 of the type shown in FIG. 3A.

Figure 23:
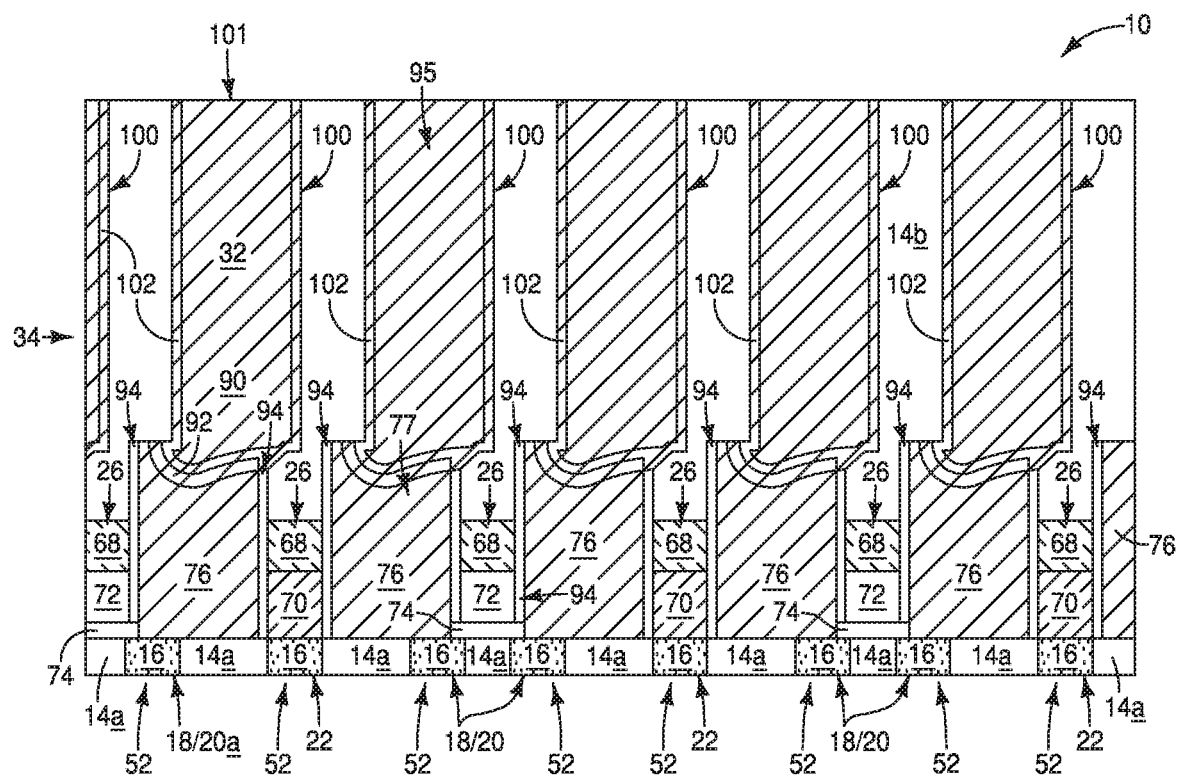
FIGS. 23 and 24 are diagrammatic cross-sectional side views along the same cross-sections as FIGS. 7 and 8 at an example process stage subsequent to that of FIGS. 17 and 18.
Figure 24:
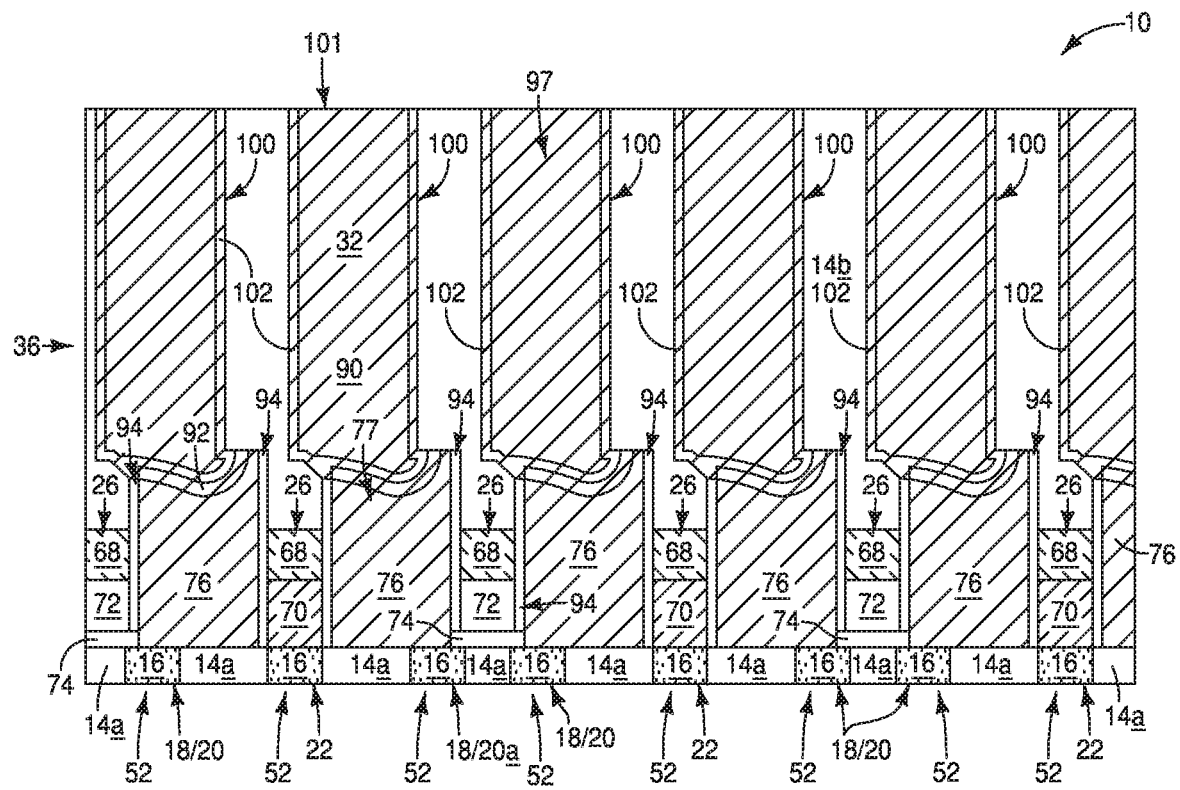

In some embodiments, a conductive liner may be formed within the openings 95 and 97 (FIGS. 17 and 18) prior to forming the conductive material 90. The conductive liner may assist with adhesion of the conductive material 90 to the insulative 14b and/or may function as a seed layer for growth of the conductive material 90. FIGS. 23 and 24 show the assembly 10 at a process stage which may follow that of FIGS. 17 and 18, and shows conductive liners 100 formed within the openings 95 and 97. The conductive liners 100 comprise liner material 102. The liner material 102 may comprise any suitable composition(s); and in some embodiments may comprise, consist essentially of, or consist of metal nitride (e.g., one or both of tungsten nitride and titanium nitride). The redistribution material 32 of FIGS. 23 and 24 may be considered to be a combination of the conductive materials 90, 92 and 102.

The redistribution configurations described above (i.e., the configurations comprising the redistribution material 32) may be utilized to shift capacitor-contact-regions in any suitable direction by any suitable amount. Although the embodiments presented herein utilize the redistribution structures to shift capacitor-contact-regions in opposing directions along the rows 34 and 36, and to shift the capacitor-contact-regions to about equal amounts along each of such opposing directions, in other embodiments the redistribution structures may be utilized to shift the capacitor-contact-regions in other directions, or by other amounts. For instance, the capacitor-contact-regions may be shifted by a different amount along the rows 34 than along the rows 36 in example embodiments alternative to those specifically shown in the figures provided herewith.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that folk and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly. The integrated assembly includes active regions which each have a digit-line-contact-region between a pair of capacitor-contact-regions. The capacitor-contact-regions are arranged in a pattern such that six adjacent capacitor-contact-regions form a substantially rectangular configuration. Conductive redistribution material is coupled with the capacitor-contact-regions and extends upwardly and laterally outwardly from the capacitor-contact-regions. Upper surfaces of the conductive redistribution material are arranged in a pattern such that seven adjacent of the upper surfaces form a unit of a substantially hexagonal-close-packed configuration. Capacitors are coupled with the upper surfaces of the conductive redistribution material.

Some embodiments include an integrated assembly comprising semiconductor-material-pillars which each have a digit-line-contact-region between a pair of capacitor-contact-regions. The capacitor-contact-regions are arranged in an array, with the array having alternating first and second rows. Conductive redistribution material is coupled with the capacitor-contact-regions. The conductive redistribution material has a first configuration along the first rows, with the first configuration extending laterally outwardly from the capacitor-contact-regions of the first rows in a first direction substantially along the first rows. The conductive redistribution material has a second configuration along the second rows, with the second configuration extending laterally outwardly from the capacitor-contact-regions of the second rows in a second direction substantially along the second rows. The second direction is substantially opposite to the first direction. The conductive redistribution material has upper surfaces. Capacitors are coupled with the upper surfaces of the conductive redistribution material.

Some embodiments include a method of forming an integrated assembly. A construction is formed to have semiconductor-material-pillars which each have a digit-line-contact-region between a pair of capacitor-contact-regions. The capacitor-contact-regions are arranged in an array, with the array having alternating first and second rows. The digit-line-contact-regions are spaced from the capacitor-contact-regions along a first cross-section along the first rows, and are spaced from the capacitor-contact-regions along a second cross-section along the second rows. Digit lines are directly over the digit-line-contact-regions along the first and second cross-sections. Conductive plugs are directly over the capacitor-contact-regions along the first and second cross-sections. An insulative mass is over the conductive plugs and the digit lines. A patterned mask is formed over the insulative mass. The patterned mask has first openings extending therethrough along the first cross-section and has second openings extending therethrough along the second cross-section. The first and second openings are aligned so that each of the first and second openings partially overlaps one of the conductive plugs and partially overlaps one of the digit lines adjacent to said one of the conductive plugs. The first and second openings are extended downwardly to the conductive plugs with a first etch. The first and second openings are extended sideways into the conductive plugs with a second etch. The first and second openings having a first shape and a second shape, respectively, after the second etch. The second shape is substantially a mirror image of the first shape. Conductive redistribution material is formed within the first and second shapes of the first and second openings. Capacitors are formed to be coupled with the conductive redistribution material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
   active regions which each have a digit-line-contact-region between a pair of capacitor-contact-regions, the capacitor-contact-regions being arranged in a pattern such that six adjacent capacitor-contact-regions form a substantially rectangular configuration;
   conductive redistribution material coupled with the capacitor-contact-regions and extending upwardly and laterally outwardly from the capacitor-contact-regions; upper surfaces of the conductive redistribution material being arranged in a pattern such that seven adjacent of the upper surfaces form a unit of a substantially hexagonal-close-packed configuration; and
   capacitors coupled with the upper surfaces of the conductive redistribution material.

2. The integrated assembly of claim 1 wherein:
   the capacitor-contact-regions are arranged in an array;
   the array has alternating first and second rows;
   the conductive redistribution material has a first configuration along the first rows, with the first configuration extending laterally outwardly from the capacitor-contact-regions of the first rows in a first direction substantially along the first rows; and
   the conductive redistribution material has a second configuration along the second rows, with the second configuration extending laterally outwardly from the capacitor-contact-regions of the second rows in a second direction substantially along the second rows; the second direction being substantially opposite to the first direction.

3. The integrated assembly of claim 1 wherein:
the active regions are pillars of semiconductor material;
each of the pillars has two trenches extending therein, with the two trenches being a first trench and a second trench;
each of the pillars has two of the capacitor-contact-regions and one of the digit-line-contact-regions, with the two capacitor-contact-regions being a first capacitor-contact-region and a second capacitor-contact-region;
a first wordline is within the first trench and gatedly couples the first capacitor-contact-region the digit-line-contact region; and
a second wordline is within the second trench and gatedly couples the second capacitor-contact-region to the digit-line-contact region.

4. The integrated assembly of claim 1 wherein:
the digit-line-contact regions are arranged in an array;
digit lines are along columns of the array and over the digit line contact regions; and
the conductive redistribution material is above the digit lines and partially laterally overlaps the digit lines.

5. The integrated assembly of claim 1 wherein the conductive redistribution material comprises metal.

6. The integrated assembly of claim 1 wherein the conductive redistribution material comprises one or more of cobalt, tungsten and titanium.

7. The integrated assembly of claim 1 wherein the conductive redistribution material comprises metal over metal silicide.

8. The integrated assembly of claim 7 wherein the metal consists essentially of one or both of tungsten and titanium; and wherein the metal silicide comprises one or more cobalt silicide, tungsten silicide and titanium silicide.

9. The integrated assembly of claim 8 wherein the conductive redistribution material further comprises metal nitride laterally along the metal.

10. The integrated assembly of claim 9 wherein the metal nitride comprises one or both of titanium nitride and tungsten nitride.

11. An integrated assembly, comprising:
semiconductor-material-pillars which each have a digit-line-contact-region between a pair of capacitor-contact-regions; the capacitor-contact-regions being arranged in an array, with the array having alternating first and second rows;
conductive redistribution material coupled with the capacitor-contact-regions; the conductive redistribution material having a first configuration along the first rows, with the first configuration extending laterally outwardly from the capacitor-contact-regions of the first rows in a first direction substantially along the first rows; the conductive redistribution material having a second configuration along the second rows, with the second configuration extending laterally outwardly from the capacitor-contact-regions of the second rows in a second direction substantially along the second rows; the second direction being substantially opposite to the first direction; the conductive redistribution material having upper surfaces; and
capacitors coupled with the upper surfaces of the conductive redistribution material.

12. The integrated assembly of claim 11 wherein:
digit lines are along columns of the array and over the digit line contact regions; and
the conductive redistribution material is above the digit lines and partially laterally overlaps the digit lines.

13. The integrated assembly of claim 11 wherein:
the digit-line-contact-regions are spaced from the capacitor-contact-regions along a cross-section along the first rows;
digit lines are directly over the digit-line-contact-regions along the cross-section;
conductive plugs are directly over the capacitor-contact-regions along the cross-section;
an insulative mass is over the conductive plugs and the digit lines; and
the conductive redistribution material extends downwardly through the insulative mass and into the conductive plugs.

14. The integrated assembly of claim 13 wherein the conductive plugs comprise conductively-doped semiconductor material.

15. The integrated assembly of claim 13 wherein the conductive plugs comprise conductively-doped silicon.

16. The integrated assembly of claim 13 wherein the conductive redistribution material is configured as boot-shaped structures along the cross-section, with each of the boot-shaped structures have a toe region extending into one of the conductive plugs and having a heel region directly over one of the digit lines.

17. The integrated assembly of claim 16 wherein:
insulative liners space the conductive plugs from the digit lines; and
the boot-shaped structures of the conductive redistribution material extend into every other one of the insulative liners along the cross-section.

18. The integrated assembly of claim 16 wherein:
the conductive redistribution material comprises a composition consisting essentially of one or both of tungsten and titanium; and
the toe regions of the boot-shaped structures comprise metal silicide.

19. The integrated assembly of claim 18 wherein the metal silicide comprises one or more of CoSi, WSi and TiSi, where the chemical formulas indicate primary constituents rather than specific stoichiometries.

20. The integrated assembly of claim 16 wherein:
the cross-section is a first cross-section and the boot-shaped structures are first boot-shaped structures;
the digit-line-contact-regions are spaced from the capacitor-contact-regions along a second cross-section along the second rows; and
the conductive redistribution material is configured as second boot-shaped structures along the second cross-section, with the second boot-shaped structures being substantially mirror images of the first boot-shaped structures.

* * * * *